US012660474B2

(12) United States Patent
Fukuda

(10) Patent No.: US 12,660,474 B2
(45) Date of Patent: Jun. 16, 2026

(54) DISPLAY DEVICE AND MANUFACTURING METHOD THEREOF

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 466 days.

(21) Appl. No.: 18/477,586

(22) Filed: Sep. 29, 2023

(65) Prior Publication Data

US 2024/0114749 A1 Apr. 4, 2024

(30) Foreign Application Priority Data

Sep. 30, 2022 (JP) ................................. 2022-158424

(51) Int. Cl.
| | | |
|---|---|---|
| *H10K 59/80* | (2023.01) | |
| *H10K 59/12* | (2023.01) | |
| *H10K 59/35* | (2023.01) | |
| *H10K 71/60* | (2023.01) | |
| *H10K 71/16* | (2023.01) | |
| *H10K 102/00* | (2023.01) | |
| *H10K 102/20* | (2023.01) | |

(52) U.S. Cl.
CPC ... *H10K 59/80517* (2023.02); *H10K 59/1201* (2023.02); *H10K 59/352* (2023.02); *H10K 59/80516* (2023.02); *H10K 59/80518* (2023.02); *H10K 71/60* (2023.02); *H10K 71/166* (2023.02); *H10K 2102/20* (2023.02); *H10K 2102/351* (2023.02)

(58) Field of Classification Search
CPC ......... H10K 59/80517; H10K 59/1201; H10K 59/352; H10K 59/80516; H10K 59/80518; H10K 71/60; H10K 71/166; H10K 2102/20; H10K 2102/351; H10K 71/621; H10K 59/8051
See application file for complete search history.

(56) References Cited

U.S. PATENT DOCUMENTS

| | | | |
|---|---|---|---|
| 11,844,246 B1 * | 12/2023 | Kawamura | ........ H10K 59/8052 |
| 2004/0160170 A1 | 8/2004 | Sato et al. | |

(Continued)

FOREIGN PATENT DOCUMENTS

| | | |
|---|---|---|
| JP | 2000-195677 A | 7/2000 |
| JP | 2004-207217 A | 7/2004 |

(Continued)

*Primary Examiner* — Kevin Quarterman
(74) *Attorney, Agent, or Firm* — XSENSUS LLP

(57) ABSTRACT

According to one embodiment, a display device includes first and second base electrodes, a rib, first and second lower electrodes, first and second organic layers, and an upper electrode. A peripheral portion of each of the first base electrode and the second base electrode is covered with the rib. Each of the first base electrode and the second base electrode is formed of a first metal material. A peripheral portion of each of the first lower electrode and the second lower electrode is located on the rib. Each of the first lower electrode and the second lower electrode is formed of a second metal material different from the first metal material. A thickness of the first lower electrode is different from a thickness of the second lower electrode.

15 Claims, 20 Drawing Sheets

(56)                    References Cited

U.S. PATENT DOCUMENTS

| 2009/0009069 A1 | 1/2009 | Takata |
| 2019/0363275 A1 | 11/2019 | Ochi et al. |
| 2022/0077251 A1 | 3/2022 | Choung et al. |

FOREIGN PATENT DOCUMENTS

| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

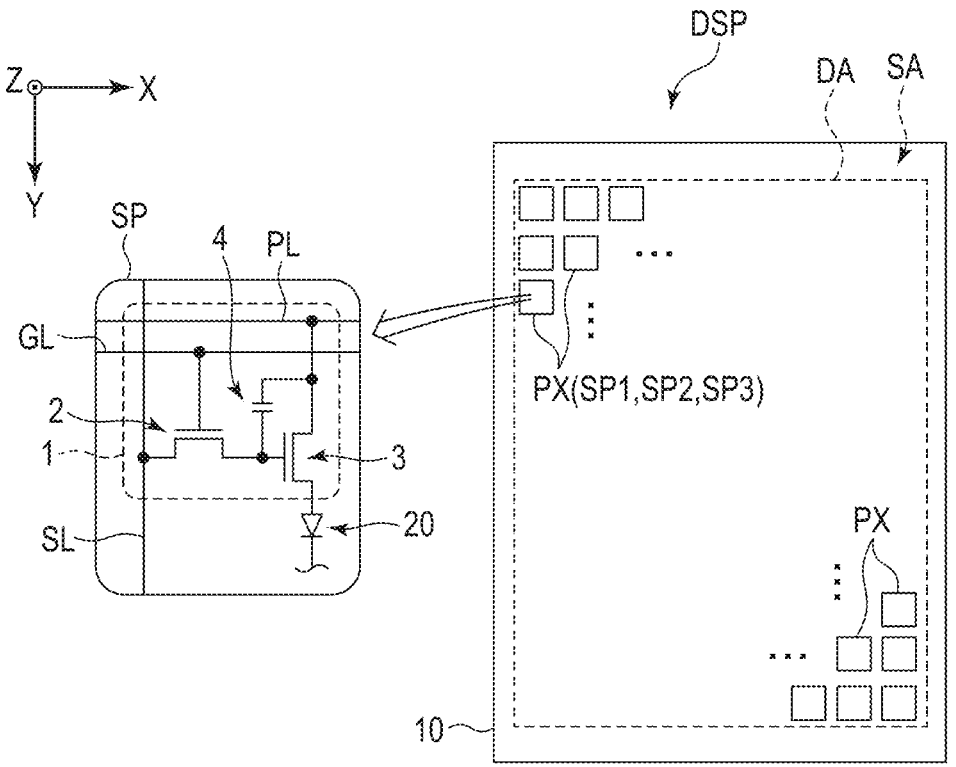
F I G. 1

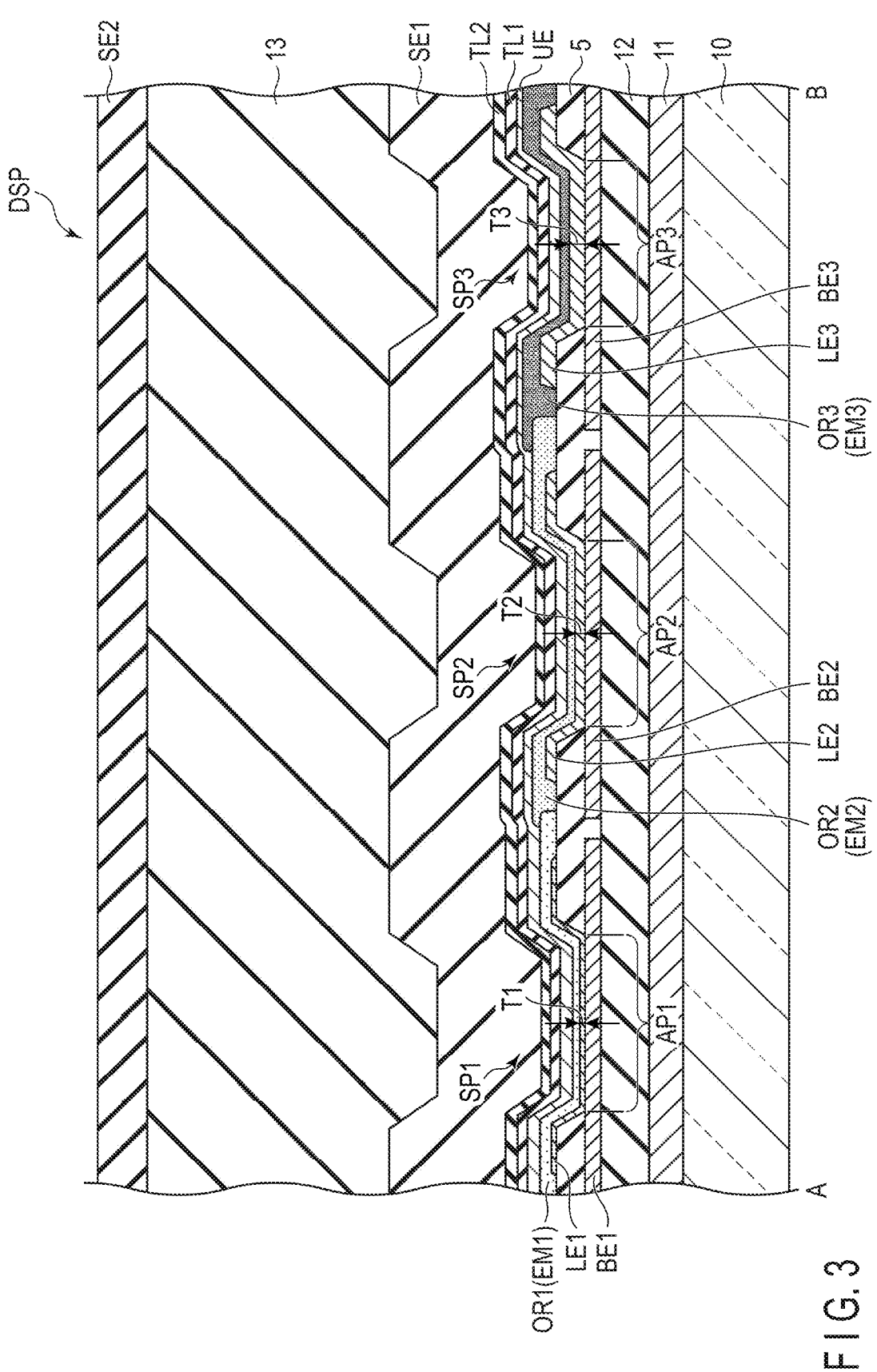
F I G. 3

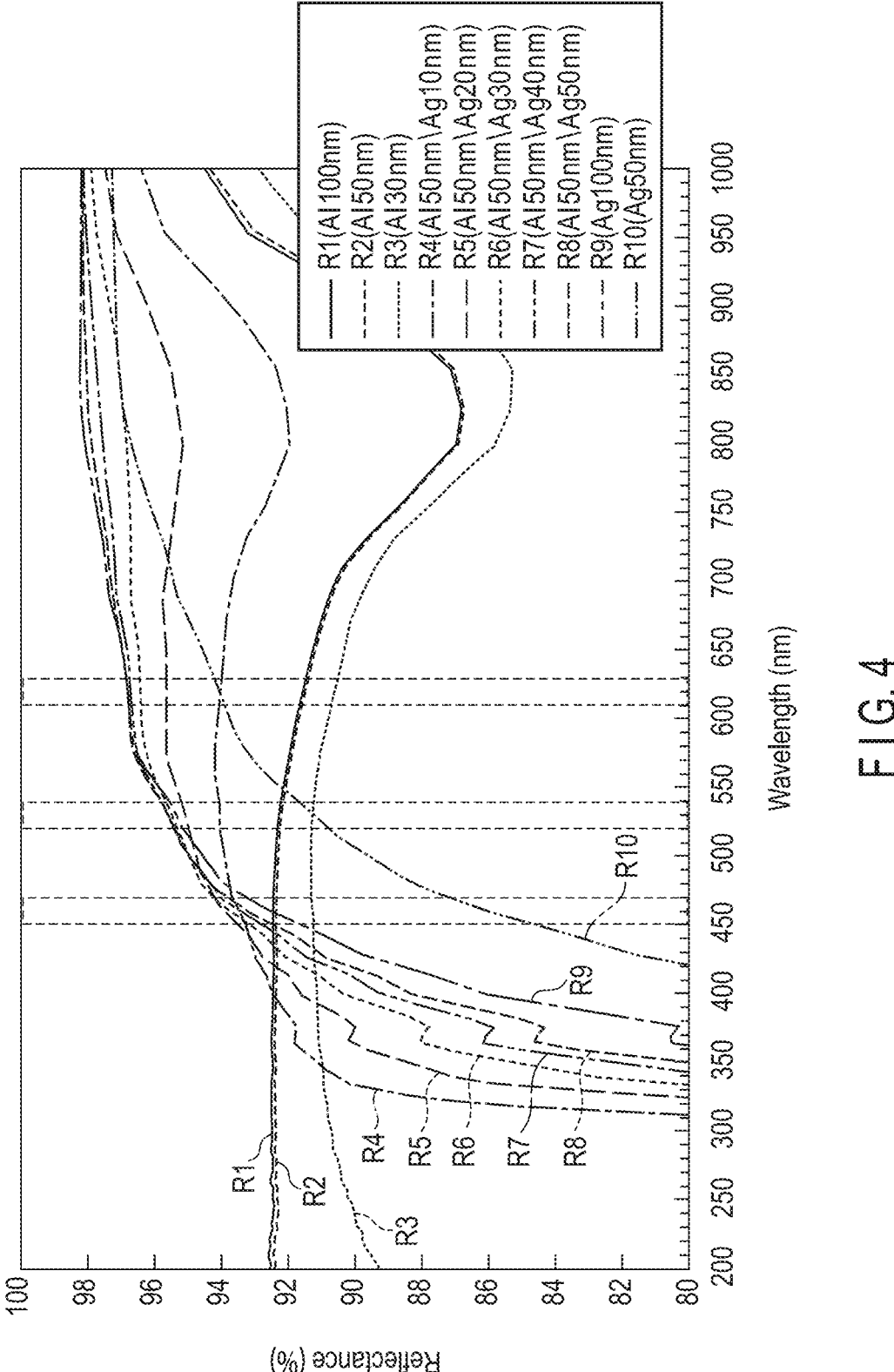
F I G. 4

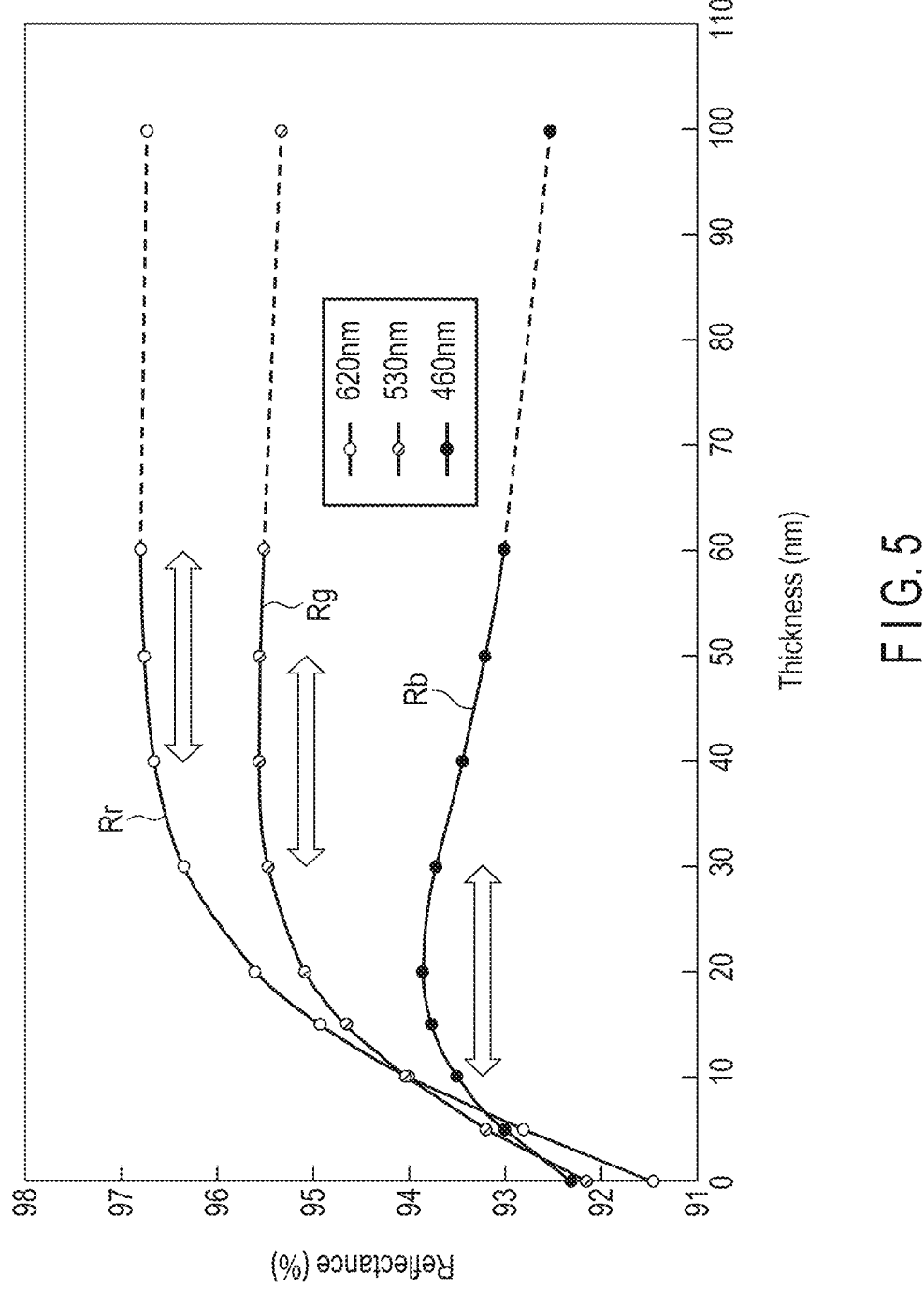
F I G. 5

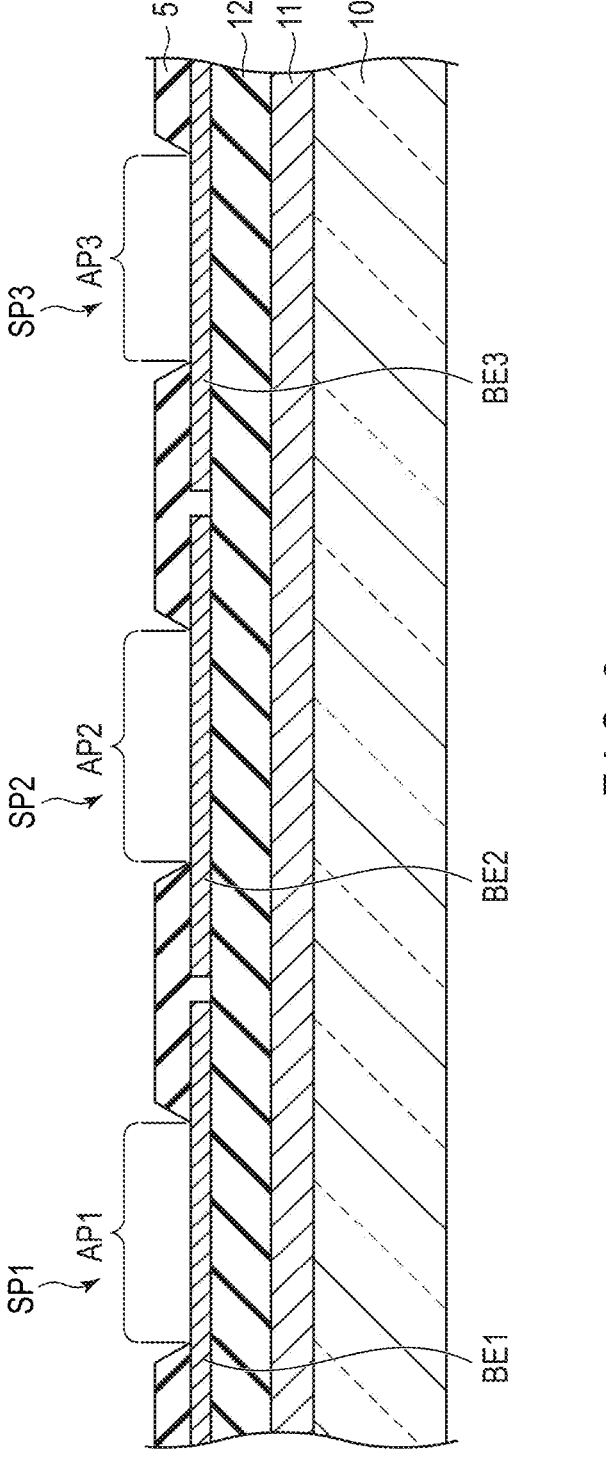
F I G. 8

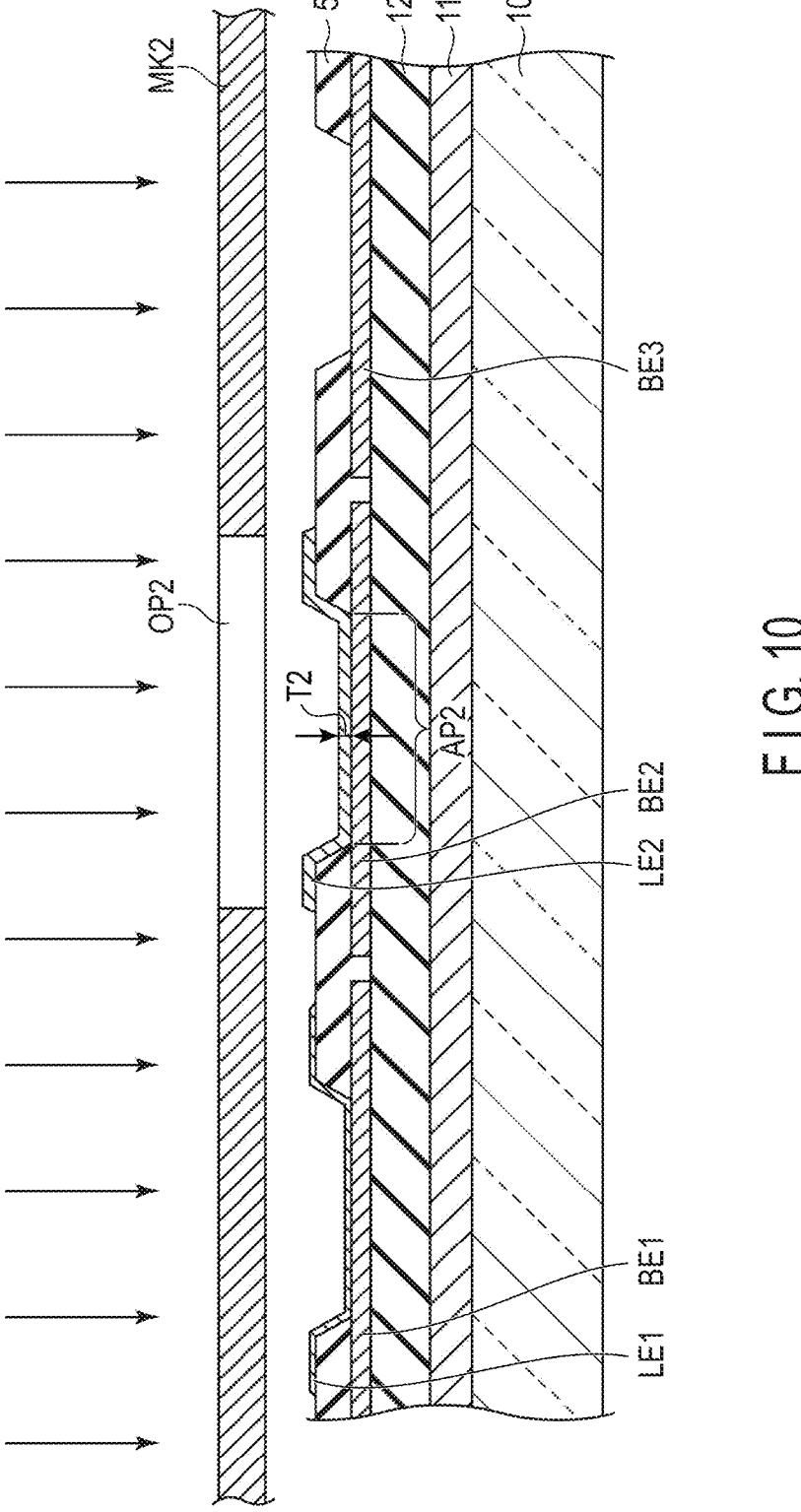
F I G. 10

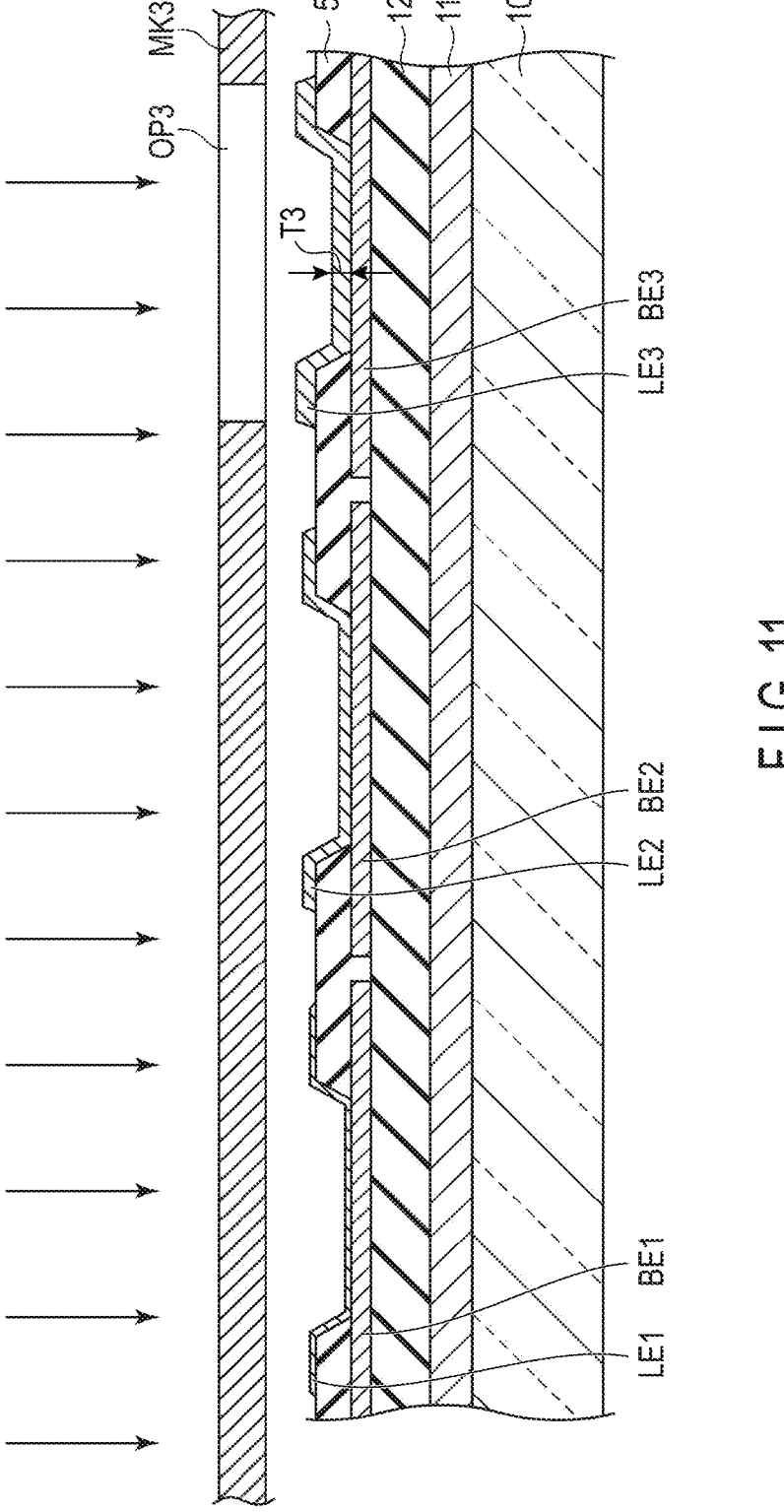
F I G. 11

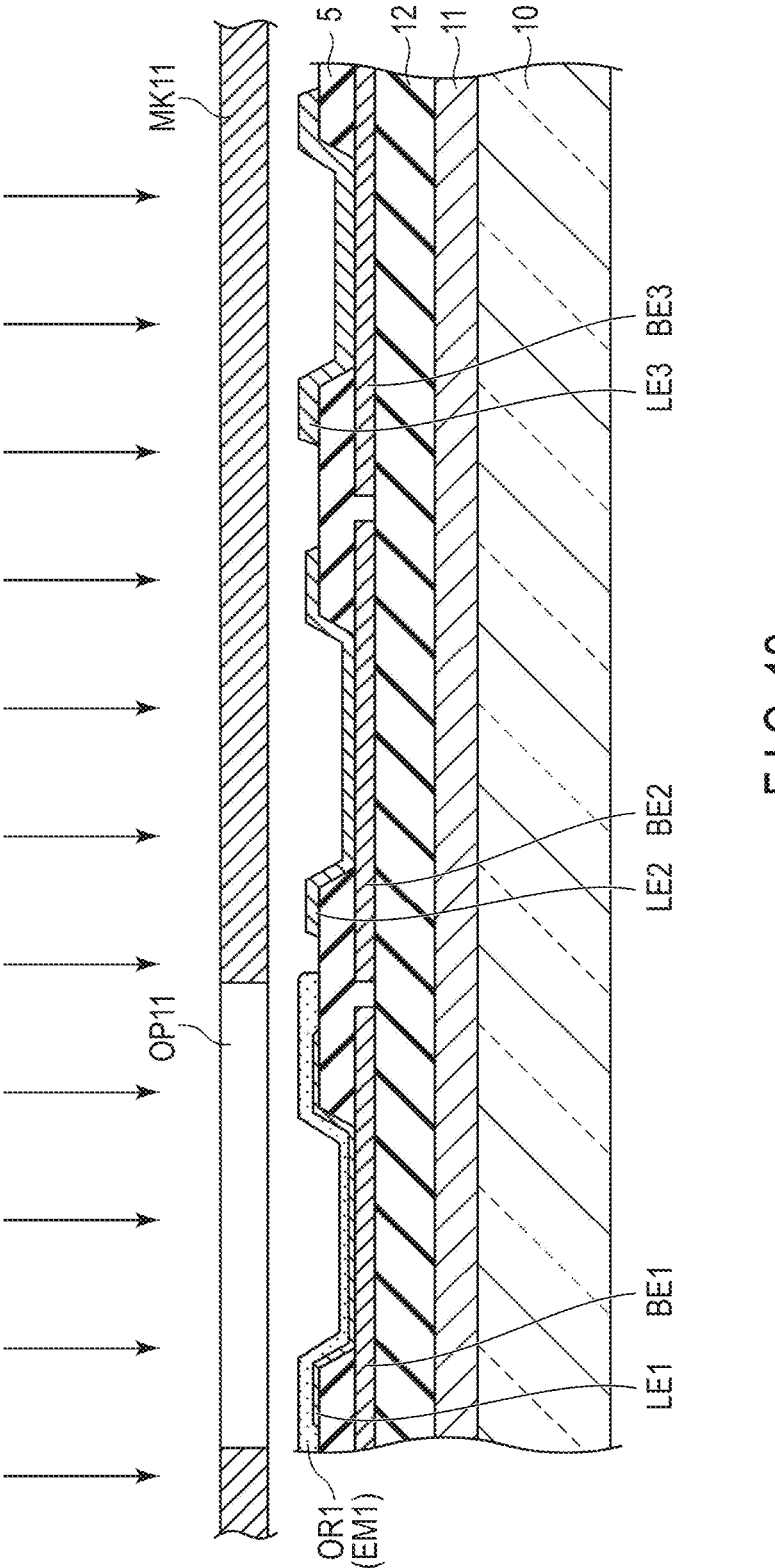
F I G. 12

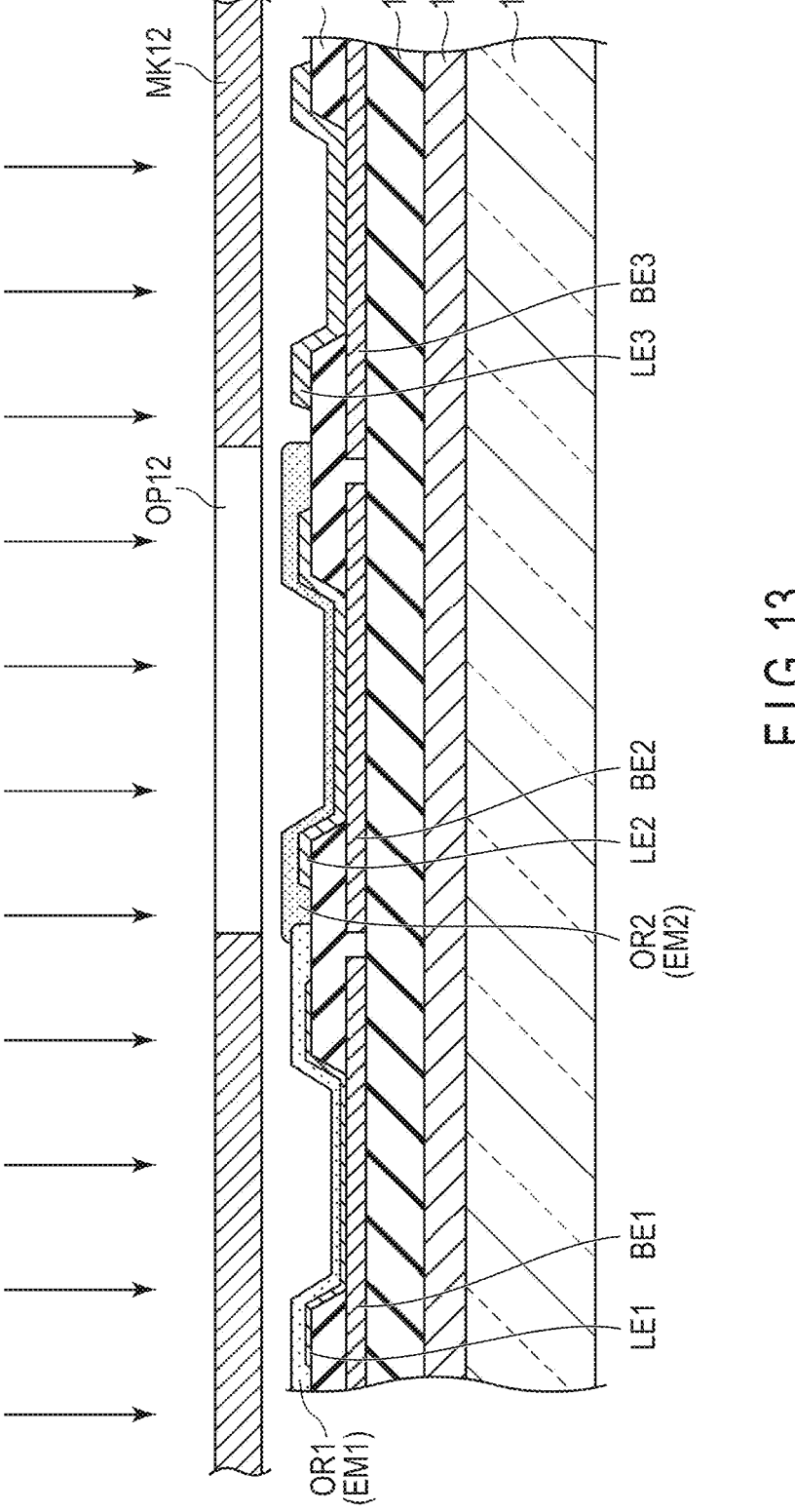
F I G . 13

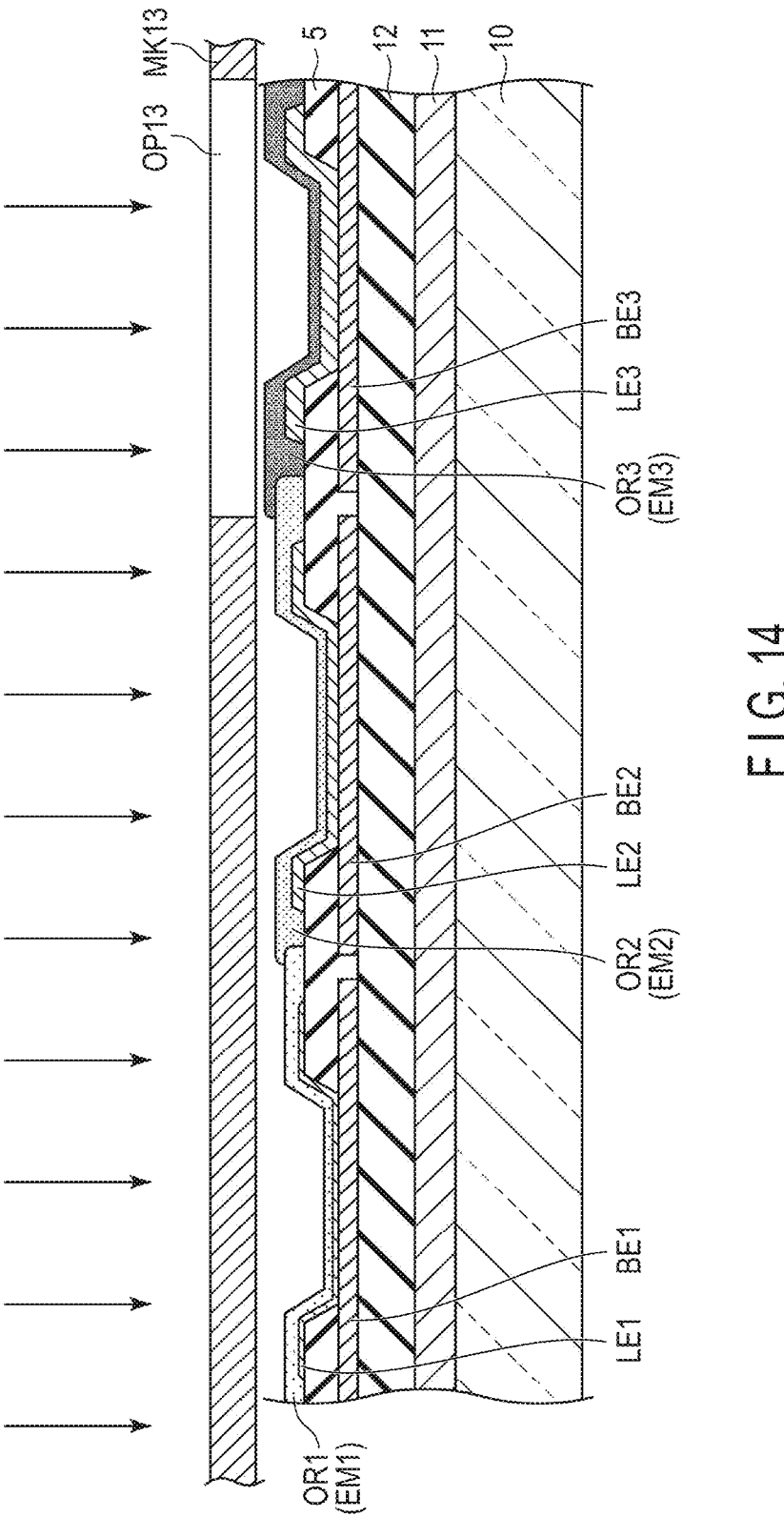
F I G. 14

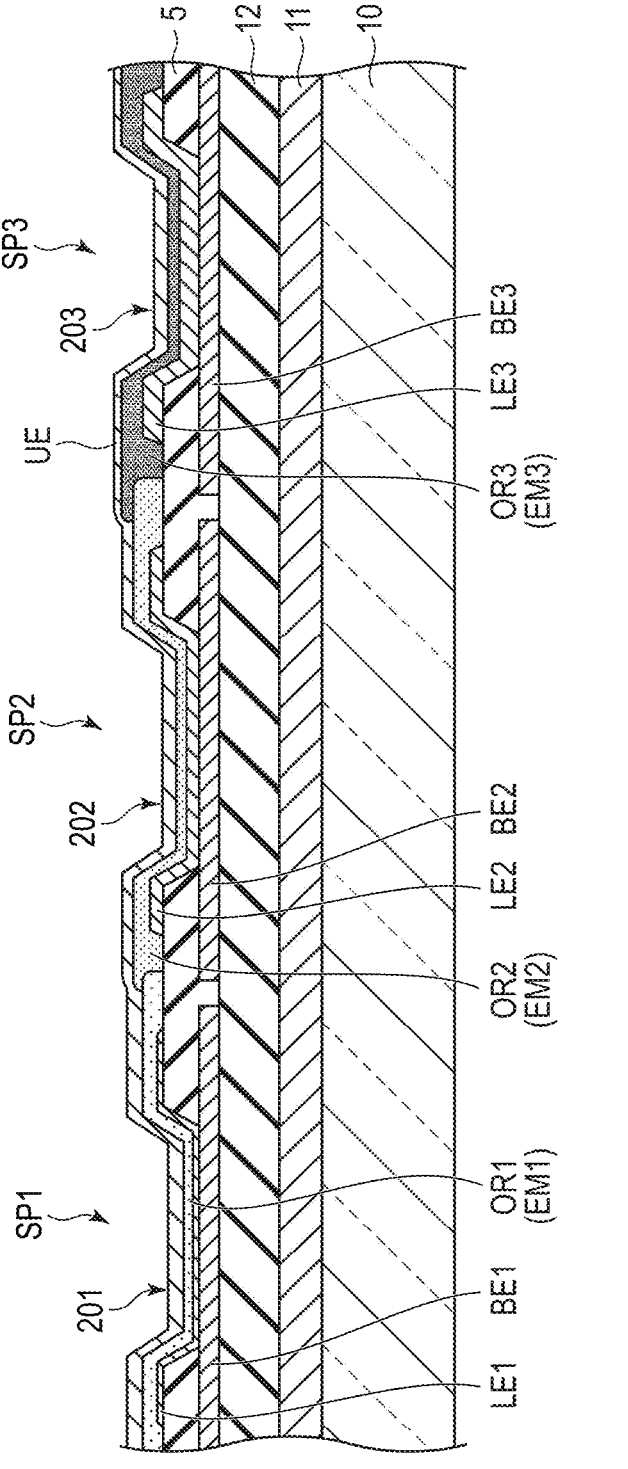
F I G. 15

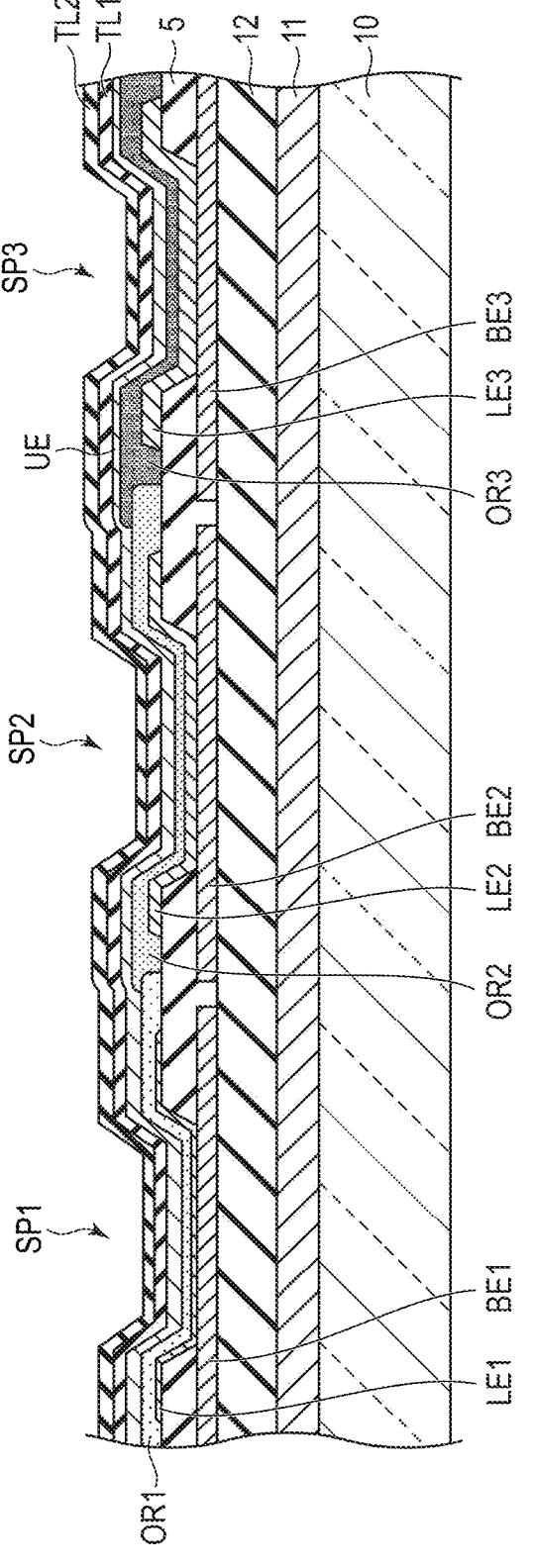
F I G. 16

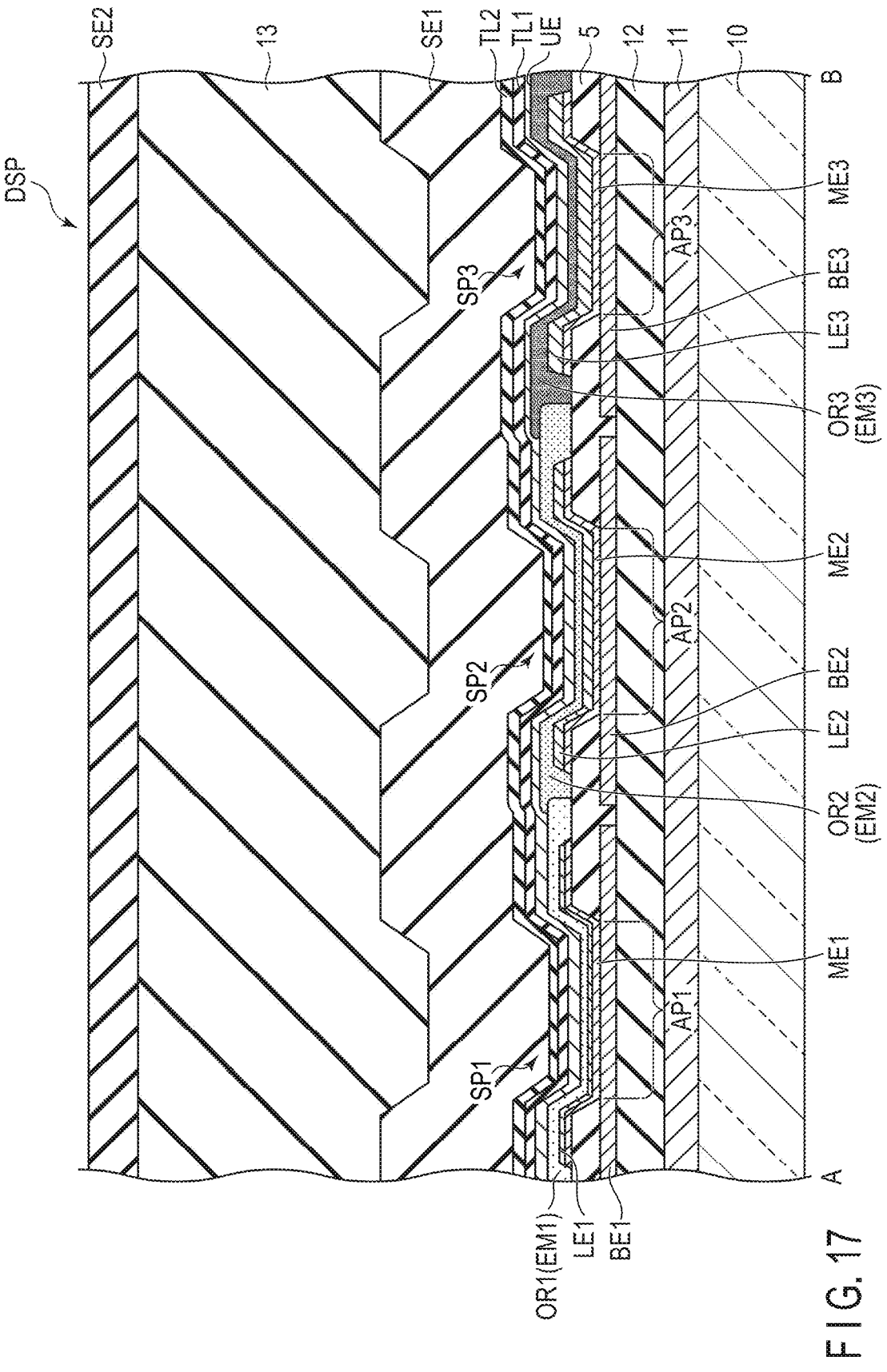
F I G. 17

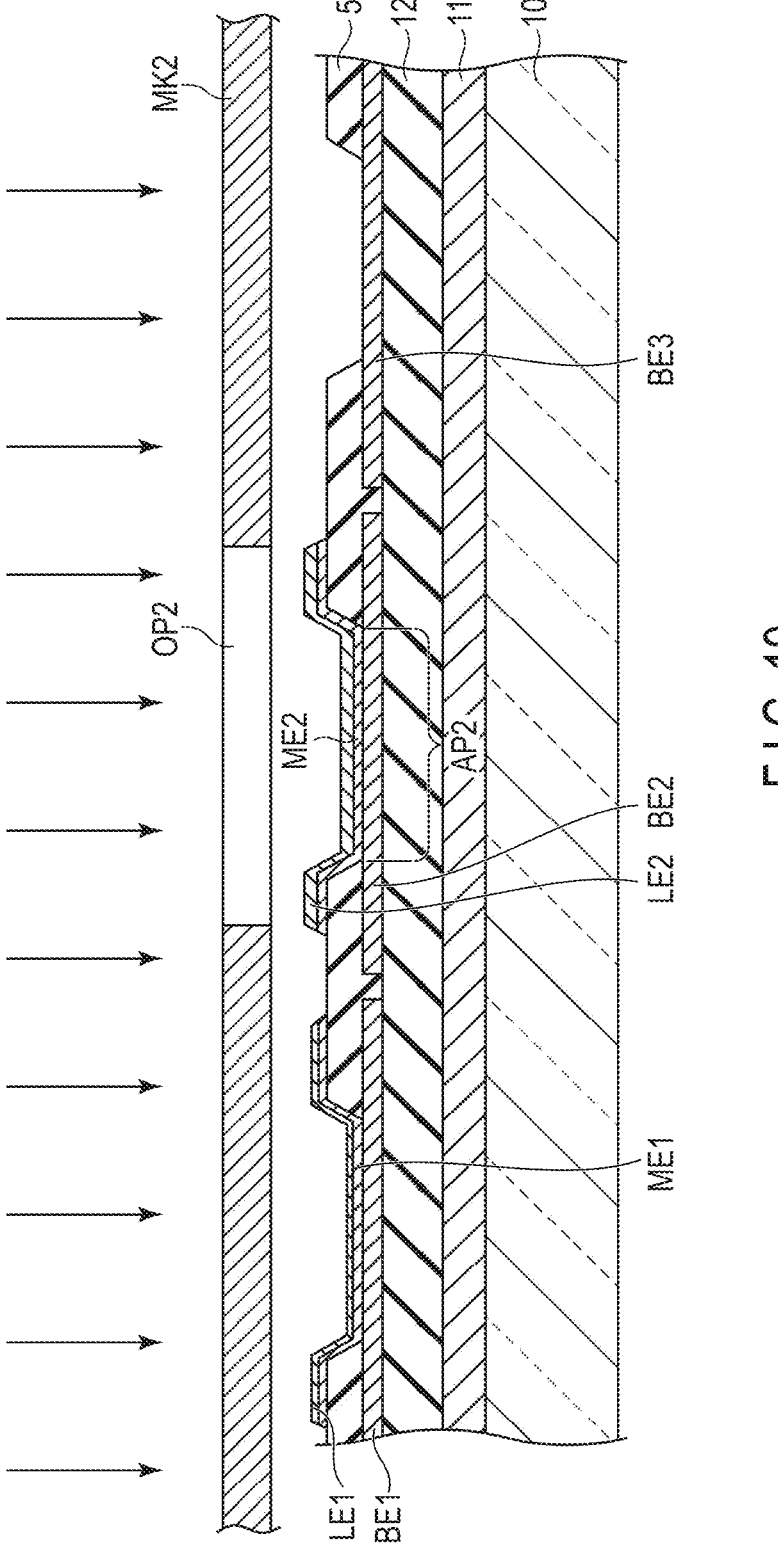
F I G. 19

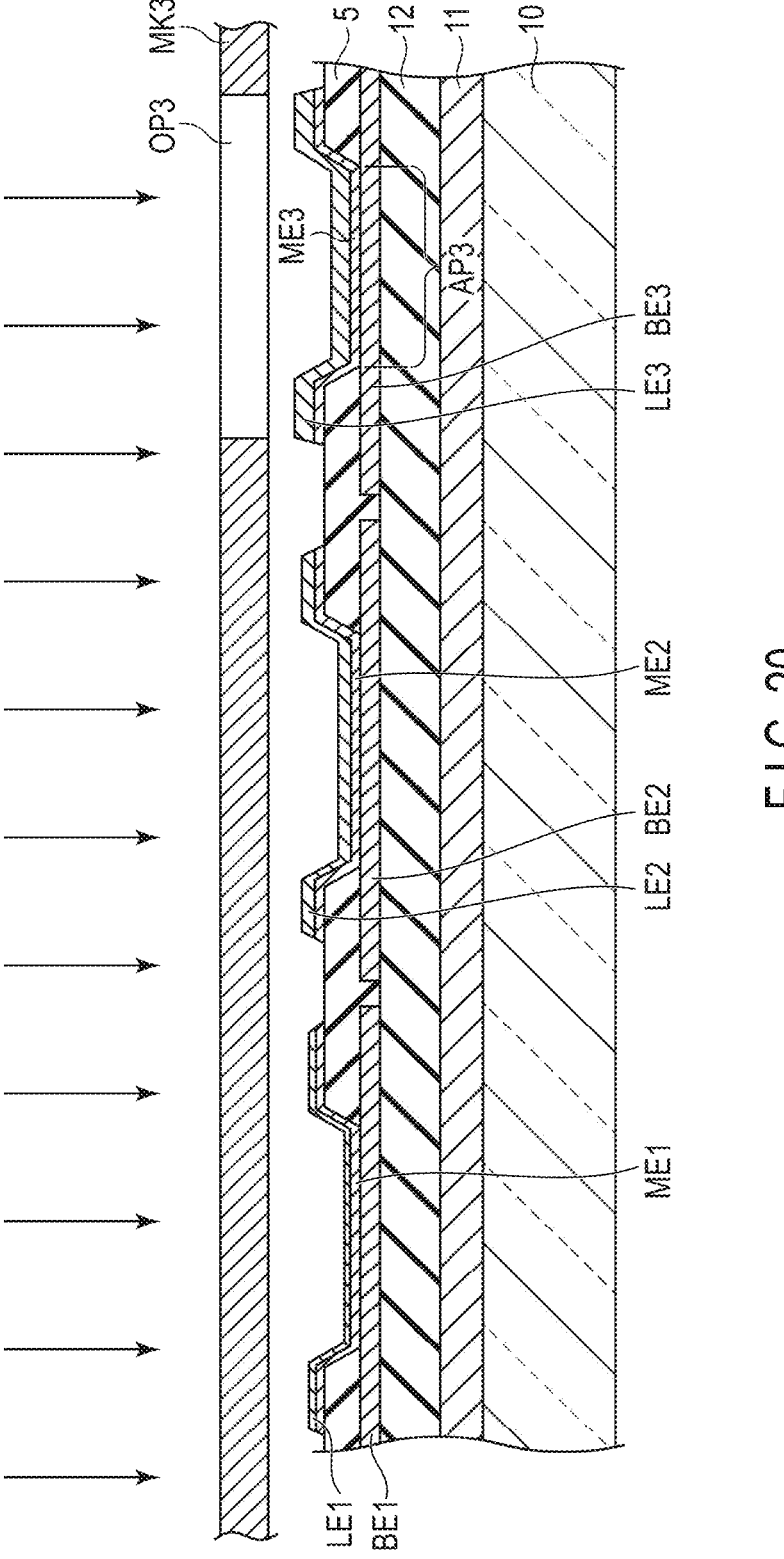
F I G. 20

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-158424, filed Sep. 30, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

In the above display element, a technique which prevents the reduction in luminous efficiency is required.

BRIEF DESCRIPTION OF THE DRAWINGS

FIG. 1 is a diagram showing a configuration example of a display device.

FIG. 3 is a cross-sectional view showing a configuration example of the display device DSP along the A-B line of FIG. 2.

FIG. 4 is a diagram showing the simulation results of reflectance.

FIG. 5 is a diagram in which the results shown in FIG. 4 are summarized for each wavelength range.

FIG. 8 is a diagram for explaining a manufacturing process following FIG. 7.

FIG. 10 is a diagram for explaining a manufacturing process following FIG. 9.

FIG. 11 is a diagram for explaining a manufacturing process following FIG. 10.

FIG. 12 is a diagram for explaining a manufacturing process following FIG. 11.

FIG. 13 is a diagram for explaining a manufacturing process following FIG. 12.

FIG. 14 is a diagram for explaining a manufacturing process following FIG. 13.

FIG. 15 is a diagram for explaining a manufacturing process following FIG. 14.

FIG. 16 is a diagram for explaining a manufacturing process following FIG. 15.

FIG. 17 is a cross-sectional view showing another configuration example of the display device DSP along the A-B line of FIG. 2.

FIG. 19 is a diagram for explaining a manufacturing process following FIG. 18.

FIG. 20 is a diagram for explaining a manufacturing process following FIG. 19.

DETAILED DESCRIPTION

Figure 2:
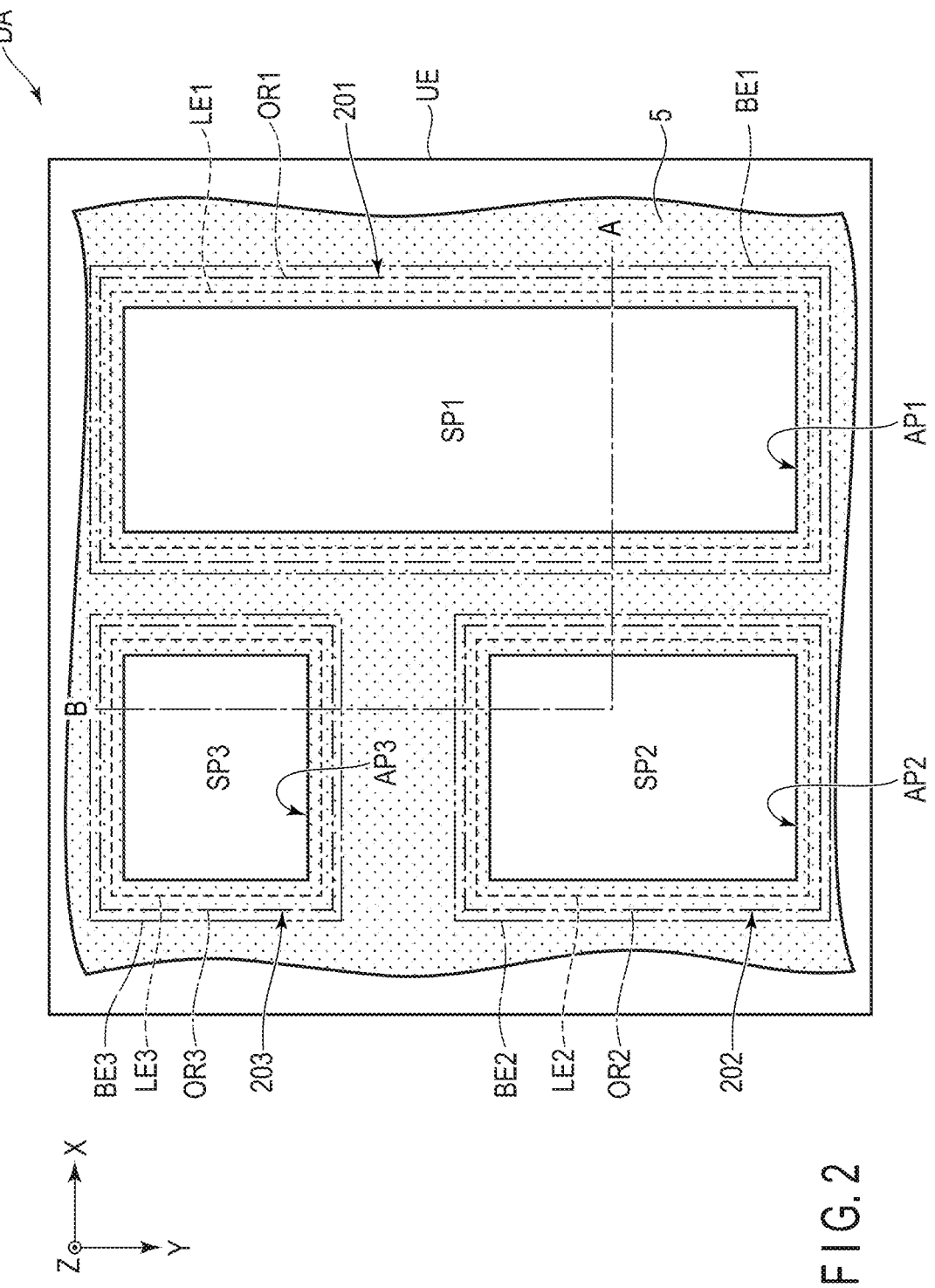
FIG. 2 is a diagram showing an example of the layout of subpixels SP1, SP2 and SP3.

In general, according to one embodiment, a display device comprises a substrate, first and second base electrodes provided above the substrate and spaced apart from each other, a rib which comprises a first aperture overlapping the first base electrode and a second aperture overlapping the second base electrode, a first lower electrode provided in the first aperture and electrically connected to the first base electrode, a second lower electrode provided in the second aperture and electrically connected to the second base electrode, a first organic layer configured to emit light which exhibits a first color and covering the first lower electrode, a second organic layer configured to emit light which exhibits a second color different from the first color and covering the second lower electrode, and an upper electrode provided on the first organic layer and the second organic layer. A peripheral portion of each of the first base electrode and the second base electrode is covered with the rib. Each of the first base electrode and the second base electrode is formed of a first metal material. A peripheral portion of each of the first lower electrode and the second lower electrode is located on the rib. Each of the first lower electrode and the second lower electrode is formed of a second metal material different from the first metal material. A thickness of the first lower electrode is different from a thickness of the second lower electrode.

According to another embodiment, a manufacturing method of a display device comprises forming a metal layer by depositing a first metal material above a substrate, forming first and second base electrodes spaced apart from each other by patterning the metal layer, forming a rib which comprises a first aperture overlapping the first base electrode and a second aperture overlapping the second base electrode, forming a first lower electrode in the first aperture by depositing a second metal material different from the first metal material via a first mask, forming a second lower electrode in the second aperture by depositing the second metal material via a second mask, forming a first organic layer which covers the first lower electrode, forming a second organic layer which covers the second lower electrode, and forming an upper electrode on the first organic layer and the second organic layer. A thickness of the first lower electrode is different from a thickness of the second lower electrode.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various types of elements are viewed parallel to the third direction Z, the appearance is defined as plan view.

The display device of the present embodiment is an organic electroluminescent (EL) display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Although not described in detail, a terminal for connecting an IC chip and a flexible printed circuit is provided in the surrounding area SA.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 is provided in the display area DA. The rib 5 comprises apertures AP1, AP2 and AP3 in subpixels SP1, SP2 and SP3, respectively.

Subpixels SP1, SP2 and SP3 comprise display elements 201, 202 and 203, respectively, as the display elements 20.

Subpixel SP1 comprises a base electrode BE1, a lower electrode LE1 and an organic layer OR1 overlapping the aperture AP1 as seen in plan view. The organic layer OR1 includes a light emitting layer which emits light exhibiting the first color. The base electrode BE1 and the lower electrode LE1 are electrically connected to each other.

Subpixel SP2 comprises a base electrode BE2, a lower electrode LE2 and an organic layer OR2 overlapping the aperture AP2 as seen in plan view. The organic layer OR2 includes a light emitting layer which emits light exhibiting the second color. The base electrode BE2 and the lower electrode LE2 are electrically connected to each other.

Subpixel SP3 comprises a base electrode BE3, a lower electrode LE3 and an organic layer OR3 overlapping the aperture AP3 as seen in plan view. The organic layer OR3 includes a light emitting layer which emits light exhibiting the third color. The base electrode BE3 and the lower electrode LE3 are electrically connected to each other.

An upper electrode UE is provided over subpixels SP1, SP2 and SP3 and overlaps the organic layers OR1, OR2 and OR3. It should be noted that the upper electrode UE may be individually provided for subpixels SP1, SP2 and SP3 and may be electrically connected to a common feed line.

The base electrode BE1, the lower electrode LE1, the organic layer OR1 and the upper electrode UE are stacked in this order and constitute the display element 201 of subpixel SP1. The base electrode BE2, the lower electrode LE2, the organic layer OR2 and the upper electrode UE are stacked in this order and constitute the display element 202 of subpixel SP2. The base electrode BE3, the lower electrode LE3, the organic layer OR3 and the upper electrode UE are stacked in this order and constitute the display element 203 of subpixel SP3.

In the example of FIG. 2, the outer shapes of the base electrodes BE1, BE2 and BE3 are shown by alternate long and two short dashes lines, and the outer shapes of the lower electrodes LE1, LE2 and LE3 are shown by dotted lines, and the outer shapes of the organic layers OR1, OR2 and OR3 are shown by alternate long and short dash lines. The peripheral portion of each of the base electrodes BE1, BE2 and BE3, the peripheral portion of each of the lower electrodes LE1, LE2 and LE3 and the peripheral portion of each of the organic layers OR1, OR2 and OR3 overlap the rib 5 as seen in plan view. It should be noted that the outer shapes of the base electrodes, lower electrodes or organic layers shown in the figure do not necessarily reflect the accurate shapes.

Each of the organic layers OR1, OR2 and OR3 consists of a stacked layer body including various functional layers such as a hole injection layer, a hole transport layer, an electron blocking layer, a hole blocking layer, an electron transport layer and an electron injection layer in addition to a light emitting layer. In the example shown in FIG. 2, these organic layers OR1, OR2 and OR3 are individual layers in which all layers are provided for each subpixel. It should be noted that the organic layers OR1, OR2 and OR3 may be a common layer in which all layers are provided over a plurality of subpixels. The organic layers OR1, OR2 and OR3 may be a combination of individual and common layers. Each layer which should be formed as an individual layer or a common layer or the color of each subpixel which should be formed as an individual layer can be appropriately selected. The thickness of each individual layer may differ depending on the subpixel.

The base electrodes BE1, BE2 and BE3 and the lower electrodes LE1, LE2 and LE3 correspond to, for example, the anodes of the display elements. The upper electrode UE corresponds to the cathodes of the display elements or a common electrode.

The base electrode BE1 and the lower electrode LE1 are electrically connected to the pixel circuit 1 (see FIG. 1) of subpixel SP1. The base electrode BE2 and the lower electrode LE2 are electrically connected to the pixel circuit 1 of subpixel SP2. The base electrode BE3 and the lower electrode LE3 are electrically connected to the pixel circuit 1 of subpixel SP3.

In the example of FIG. 2, the area of the aperture AP1 which overlaps the base electrode BE1, the area of the aperture AP2 which overlaps the base electrode BE2 and the area of the aperture AP3 which overlaps the base electrode BE3 are different from each other. The area of the aperture AP2 is less than that of the aperture AP1, and the area of the aperture AP3 is less than that of the aperture AP2. In other words, the area of the base electrode BE2 exposed from the aperture AP2 is less than that of the base electrode BE1 exposed from the aperture AP1. The area of the base electrode BE3 exposed from the aperture AP3 is less than that of the base electrode BE2 exposed from the aperture AP2.

For example, the display element 201 of subpixel SP1 is configured to emit light in a blue wavelength range as the first color. The display element 202 of subpixel SP2 is configured to emit light in a green wavelength range as the second color whose wavelength is longer than the first color. The display element 203 of subpixel SP3 is configured to emit light in a red wavelength range as the third color whose wavelength is longer than the second color.

FIG. 3 is a cross-sectional view showing a configuration example of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The base electrodes BE1, BE2 and BE3 are provided on the insulating layer 12 and are spaced apart from each other. The rib 5 is provided on the insulating layer 12 and the base electrodes BE1, BE2 and BE3. The aperture AP1 of the rib 5 overlaps the base electrode BE1. The aperture AP2 overlaps the base electrode BE2. The aperture AP3 overlaps the base electrode BE3. The peripheral portions of the base electrodes BE1, BE2 and BE3 are covered with the rib 5. Between, of the base electrodes BE1, BE2 and BE3, the base electrodes which are adjacent to each other, the insulating layer 12 is covered with the rib 5.

The lower electrode LE1 is in contact with the base electrode BE1 through the aperture AP1 and covers the base electrode BE1 exposed from the aperture AP1. The peripheral portion of the lower electrode LE1 is located on the rib 5. The organic layer OR1 covers the lower electrode LE1. The peripheral portion of the organic layer OR1 is located outside the lower electrode LE1 and is located on the rib 5. In the example shown in the figure, the peripheral portion of the lower electrode LE1 and the peripheral portion of the organic layer OR1 are in contact with the rib 5. The upper electrode UE faces the lower electrode LE1 and is provided on the organic layer OR1.

The lower electrode LE2 is in contact with the base electrode BE2 through the aperture AP2 and covers the base electrode BE2 exposed from the aperture AP2. The peripheral portion of the lower electrode LE2 is located on the rib 5. The lower electrode LE2 is spaced apart from the lower electrode LE1 on the rib 5. The organic layer OR2 covers the lower electrode LE2. The peripheral portion of the organic layer OR2 is located outside the lower electrode LE2 and is located on the rib 5. In the example shown in the figure, the peripheral portion of the lower electrode LE2 and the peripheral portion of the organic layer OR2 are in contact with the rib 5. In the example shown in the figure, the peripheral portion of the organic layer OR2 overlaps the peripheral portion of the organic layer OR1. However, the peripheral portion of the organic layer OR2 may be spaced apart from the organic layer OR1. The upper electrode UE faces the lower electrode LE2 and is provided on the organic layer OR2.

The lower electrode LE3 is in contact with the base electrode BE3 through the aperture AP3 and covers the base electrode BE3 exposed from the aperture AP3. The peripheral portion of the lower electrode LE3 is located on the rib 5. The lower electrode LE3 is spaced apart from the lower electrode LE2 on the rib 5. The organic layer OR3 covers the lower electrode LE3. The peripheral portion of the organic layer OR3 is located outside the lower electrode LE3 and is located on the rib 5. In the example shown in the figure, the peripheral portion of the lower electrode LE3 and the peripheral portion of the organic layer OR3 are in contact with the rib 5. In the example shown in the figure, the peripheral portion of the organic layer OR3 overlaps the peripheral portion of the organic layer OR2. However, the peripheral portion of the organic layer OR3 may be spaced apart from the organic layer OR2. The upper electrode UE faces the lower electrode LE3 and is provided on the organic layer OR3.

In this manner, the upper electrode UE is a common layer provided over subpixels SP1, SP2 and SP3.

Transparent layers TL1 and TL2, sealing layers SE1 and SE2 and a resin layer 13 are common layers provided over subpixels SP1, SP2 and SP3.

The transparent layer TL1 is provided on the upper electrode UE. The transparent layer TL2 is provided on the transparent layer TL1. The stacked layer body of the transparent layer TL1 and the transparent layer TL2 functions as an optical adjustment layer for adjusting the optical property of the light emitted from each of the organic layers OR1, OR2 and OR3.

The sealing layer SE1 is provided on the transparent layer TL2. The resin layer 13 is provided on the sealing layer SE1. The sealing layer SE2 is provided on the resin layer 13.

Each of the insulating layer 12 and the resin layer 13 is formed of an organic insulating material. The rib 5 is formed of, for example, an organic insulating material. However, the rib 5 may be formed of an inorganic insulating material.

Each of the sealing layers SE1 and SE2 is formed of silicon nitride (SiNx) as an example of inorganic insulating materials. However, each of the sealing layers SE1 and SE2 may be formed of another inorganic insulating material such as silicon oxide (SiOx), silicon oxynitride (SiON) or aluminum oxide ($Al_2O_3$).

Each of the transparent layers TL1 and TL2 is formed of an inorganic insulating material or an organic insulating material. The refractive index of the transparent layer TL1 is greater than that of the transparent layer TL2. In other words, the transparent layer TL1 corresponds to the high-refractive layer of the optical adjustment layer. The transparent layer TL2 corresponds to the low-refractive layer of the optical adjustment layer.

The upper electrode UE is formed of, for example, a metal material such as an alloy of magnesium and silver (MgAg).

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range (first color). The light emitting layer EM2 is formed of a material which emits light in a green wavelength range (second color). The light emitting layer EM3 is formed of a material which emits light in a red wavelength range (third color).

As described above, each of the organic layers OR1, OR2 and OR3 includes functional layers such as a hole injection layer, a hole transport layer, an electron blocking layer, a hole blocking layer, an electron transport layer and an electron injection layer.

Each of the base electrodes BE1, BE2 and BE3 is a metal electrode formed of a first metal material and does not include an oxide conductive layer formed of indium tin oxide (ITO), etc. The first metal material is aluminum or an aluminum alloy.

Each of the lower electrodes LE1, LE2 and LE3 is a metal electrode formed of a second metal material different from the first metal material and does not include an oxide conductive layer formed of ITO, etc. The second metal material is silver.

Thus, no oxide conductive layer is provided immediately under the organic layer OR1 in the aperture AP1. The stacked layer body of the base and lower electrodes BE1 and LE1 formed of different types of metals functions as a reflecting electrode which reflects the light emitted from the light emitting layer EM1 of the organic layer OR1.

Similarly, no oxide conductive layer is provided immediately under the organic layer OR2 in the aperture AP2. The stacked layer body of the base and lower electrodes BE2 and LE2 formed of different types of metals functions as a reflecting electrode which reflects the light emitted from the light emitting layer EM2 of the organic layer OR2.

Similarly, no oxide conductive layer is provided immediately under the organic layer OR3 in the aperture AP3. The stacked layer body of the base and lower electrodes BE3 and LE3 formed of different types of metals functions as a reflecting electrode which reflects the light emitted from the light emitting layer EM3 of the organic layer OR3.

Thickness T1 of the lower electrode LE1 in the aperture AP1 (the distance parallel to the normal of the substrate 10 between the base electrode BE1 and the organic layer OR1), thickness T2 of the lower electrode LE2 in the aperture AP2 (the distance parallel to the normal of the substrate 10 between the base electrode BE2 and the organic layer OR2)

and thickness T3 of the lower electrode LE3 in the aperture AP3 (the distance parallel to the normal of the substrate 10 between the base electrode BE3 and the organic layer OR3) are different from each other.

For example, thickness T2 is greater than thickness T1, and thickness T3 is greater than thickness T2. It should be noted that thickness T3 may be equal to thickness T2 ($T1<T2\leq T3$).

In such a display device, when a potential difference is formed between the lower electrode LE1 and the upper electrode UE, the light emitting layer EM1 of the organic layer OR1 emits light in a blue wavelength range. When a potential difference is formed between the lower electrode LE2 and the upper electrode UE, the light emitting layer EM2 of the organic layer OR2 emits light in a green wavelength range. When a potential difference is formed between the lower electrode LE3 and the upper electrode UE, the light emitting layer EM3 of the organic layer OR3 emits light in a red wavelength range.

Of the blue light emitted from the light emitting layer EM1, blue light which proceeds to the lower electrode LE1 is reflected on the reflecting electrode which is the stacked layer body of the base electrode BE1 and the lower electrode LE1. At this time, as no ITO layer is present between the organic layer OR1 and the reflecting electrode, undesired absorption of blue light by an ITO layer is prevented. In particular, the light absorption index of an ITO layer is high in a blue wavelength range. Therefore, the loss of blue light is large. Thus, the luminous efficiency can be improved. Here, the luminous efficiency corresponds to the luminance per unit current in the frontal direction of the display device DSP (current luminance efficiency).

Of the green light emitted from the light emitting layer EM2, green light which proceeds to the lower electrode LE2 is reflected on the reflecting electrode which is the stacked layer body of the base electrode BE2 and the lower electrode LE2. At this time, as no ITO layer is present between the organic layer OR2 and the reflecting electrode, undesired absorption of green light by an ITO layer is prevented.

Of the red light emitted from the light emitting layer EM3, red light which proceeds to the lower electrode LE3 is reflected on the reflecting electrode which is the stacked layer body of the base electrode BE3 and the lower electrode LE3. At this time, as no ITO layer is present between the organic layer OR3 and the reflecting electrode, undesired absorption of red light by an ITO layer is prevented.

Now, this specification explains the relationship between the thicknesses of the base and lower electrodes and the reflectance.

FIG. 4 is a diagram showing the simulation results of reflectance.

The horizontal axis indicates the wavelength (nm), and the vertical axis indicates the reflectance (%).

In the figure, R1 represents the result which is obtained when a silver layer is omitted and an aluminum layer having a thickness of 100 nm is located on an inorganic insulating layer.

In the figure, R2 represents the result which is obtained when a silver layer is omitted and an aluminum layer having a thickness of 50 nm is located on an inorganic insulating layer.

In the figure, R3 represents the result which is obtained when a silver layer is omitted and an aluminum layer having a thickness of 30 nm is located on an inorganic insulating layer.

In the figure, R4 represents the result which is obtained when an aluminum layer having a thickness of 50 nm is located on an inorganic insulating layer and a silver layer having a thickness of 10 nm is located on the aluminum layer.

In the figure, R5 represents the result which is obtained when an aluminum layer having a thickness of 50 nm is located on an inorganic insulating layer and a silver layer having a thickness of 20 nm is located on the aluminum layer.

In the figure, R6 represents the result which is obtained when an aluminum layer having a thickness of 50 nm is located on an inorganic insulating layer and a silver layer having a thickness of 30 nm is located on the aluminum layer.

In the figure, R7 represents the result which is obtained when an aluminum layer having a thickness of 50 nm is located on an inorganic insulating layer and a silver layer having a thickness of 40 nm is located on the aluminum layer.

In the figure, R8 represents the result which is obtained when an aluminum layer having a thickness of 50 nm is located on an inorganic insulating layer and a silver layer having a thickness of 50 nm is located on the aluminum layer.

In the figure, R9 represents the result which is obtained when a silver layer having a thickness of 100 nm is located on an inorganic insulating layer and an aluminum layer is omitted.

In the figure, R10 represents the result which is obtained when a silver layer having a thickness of 50 nm is located on an inorganic insulating layer and an aluminum layer is omitted.

It should be noted that the inorganic insulating layer used here is a silicon oxide layer. It is assumed that the surface of the aluminum layer or silver layer which is the top layer is in contact with air.

For example, the blue wavelength range (first color) of the light emitted from the light emitting layer EM1 is 450 nm to 470 nm. The center wavelength (peak) of the blue wavelength range is 460 nm.

The green wavelength range (second color) of the light emitted from the light emitting layer EM2 is 520 nm to 540 nm. The center wavelength (peak) of the green wavelength range is 530 nm.

The red wavelength range (third color) of the light emitted from the light emitting layer EM3 is 610 nm to 630 nm. The center wavelength (peak) of the red wavelength range is 620 nm.

When this specification focuses attention on an aluminum layer as a single layer, the following matters are confirmed. A high reflectance is obtained in a case where the thickness of the aluminum layer is 100 nm (R1) and a case where the thickness of the aluminum layer is 50 nm (R2) compared to a case where the thickness of the aluminum layer is 30 nm (R3). It is also confirmed that substantially an equal reflectance is obtained in a case where the thickness is greater than or equal to 50 nm. Thus, when an aluminum layer is applied as a base electrode, the thickness of the base electrode should be preferably greater than or equal to 50 nm.

When this specification focuses attention on a silver layer as a single layer, the following matters are confirmed. The reflectance in the blue wavelength range is low in a case where the thickness of the silver layer is 100 nm (R9) and a case where the thickness of the silver layer is 50 nm (R10).

When this specification focuses attention on the stacked layer body of an aluminum layer and a silver layer, the following matters are confirmed. A high reflectance is obtained in each of the blue wavelength range, the green wavelength range and the red wavelength range in all cases (R4 to R8) compared to the case of the single-layer body of an aluminum layer and the case of the single-layer body of a silver layer. Thus, when a stacked layer body of a base electrode (aluminum layer) and a lower electrode (silver layer) is applied as a reflecting electrode, the thickness of the lower electrode should be preferably greater than or equal to 10 nm.

FIG. 5 is a diagram in which the results shown in FIG. 4 are summarized for each wavelength range.

The horizontal axis indicates the thickness (nm) of a silver layer stacked on an aluminum layer having a thickness of 50 nm.

The vertical axis indicates the reflectance (%).

A case where the thickness of the horizontal axis is 0 nm corresponds to a case where a silver layer is omitted and an aluminum layer having a thickness of 50 nm is provided as a single layer. A case where the thickness of the horizontal axis is 100 nm corresponds to a case where an aluminum layer is omitted and a silver layer having a thickness of 100 nm is provided as a single layer.

When this specification focuses attention on reflectance Rb of the center wavelength (460 nm) of the blue wavelength range, it is confirmed that a high reflectance is obtained in a range in which the thickness of the silver layer is greater than or equal to 10 nm but less than or equal to 30 nm. In the stacked layer body of the base electrode (aluminum layer) BE1 and the lower electrode (silver layer) LE1, the thickness of the lower electrode LE1 is less than that of the base electrode BE1.

When this specification focuses attention on reflectance Rg of the center wavelength (530 nm) of the green wavelength range, it is confirmed that a high reflectance is obtained in a range in which the thickness of the silver layer is greater than or equal to 30 nm. To improve the efficiency of the manufacturing process, the thickness of the silver layer should be preferably less than or equal to 50 nm. In the stacked layer body of the base electrode (aluminum layer) BE2 and the lower electrode (silver layer) LE2, the thickness of the lower electrode LE2 is equal to that of the base electrode BE2 or less than that of the base electrode BE2.

When this specification focuses attention on reflectance Rr of the center wavelength (620 nm) of the red wavelength range, it is confirmed that a high reflectance is obtained in a range in which the thickness of the silver layer is greater than or equal to 40 nm. To improve the efficiency of the manufacturing process, the thickness of the silver layer should be preferably less than or equal to 60 nm.

Now, this specification explains the manufacturing method of the display device DSP described above with reference to FIG. 6 to FIG. 16.

Figure 6:
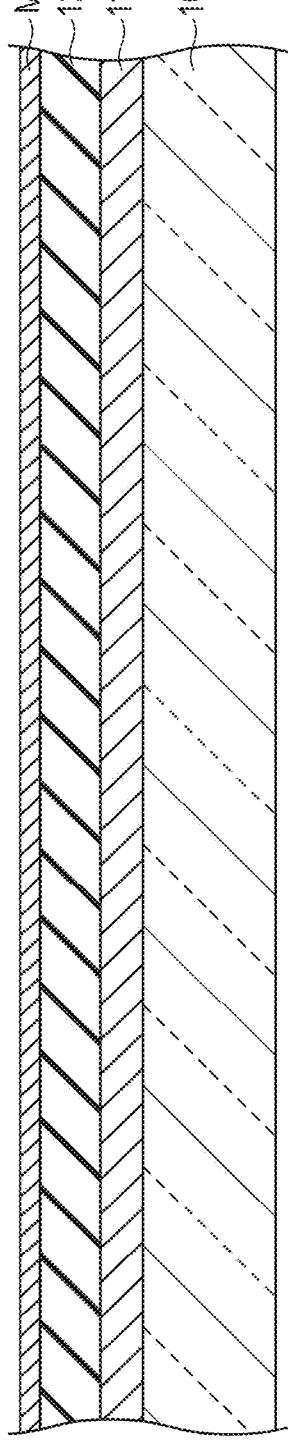
FIG. 6 is a diagram for explaining the manufacturing process of the display device DSP shown in FIG. 3.

First, as shown in FIG. 6, after the circuit layer 11 and the insulating layer 12 are formed on the substrate 10, the first metal material is deposited on the insulating layer 12 to form a metal layer M. The first metal material is, for example, aluminum. The thickness of the metal layer M is, for example, 50 nm.

Figure 7:
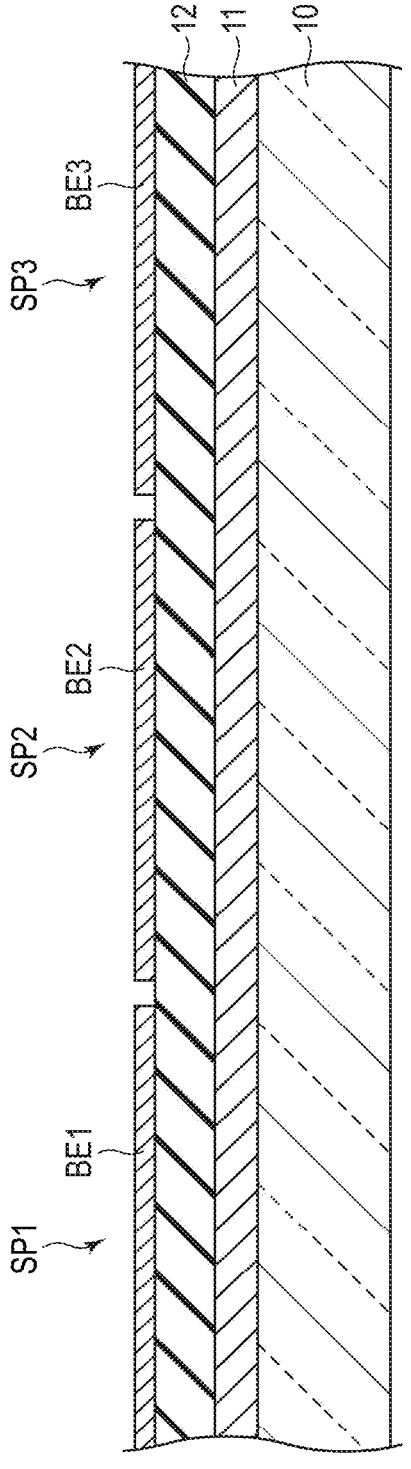
FIG. 7 is a diagram for explaining a manufacturing process following FIG. 6.

Subsequently, as shown in FIG. 7, the metal layer M is patterned to form the base electrodes BE1, BE2 and BE3 which are spaced apart from each other. The base electrode BE1 is located in subpixel SP1. The base electrode BE2 is located in subpixel SP2. The base electrode BE3 is located in subpixel SP3. Here, the patterning includes the process of forming a resist having a predetermined shape on the metal layer M, the process of removing part of the metal layer M by dry etching using the resist as a mask and the process of removing the resist.

Subsequently, as shown in FIG. 8, the rib 5 comprising the aperture AP1 which overlaps the base electrode BE1, the aperture AP2 which overlaps the base electrode BE2 and the aperture AP3 which overlaps the base electrode BE3 is formed. The process of forming the rib 5 includes the process of applying an organic insulating material, the process of exposing the organic insulating material via a mask, the process of developing the exposed organic insulating material and the process of burning the organic insulating material. Since the rib 5 is formed of an organic insulating material, an etching process is unnecessary, and the damage to the base electrodes BE1, BE2 and BE3 is reduced, compared to a case where the rib 5 is formed of an inorganic insulating material.

Figure 9:
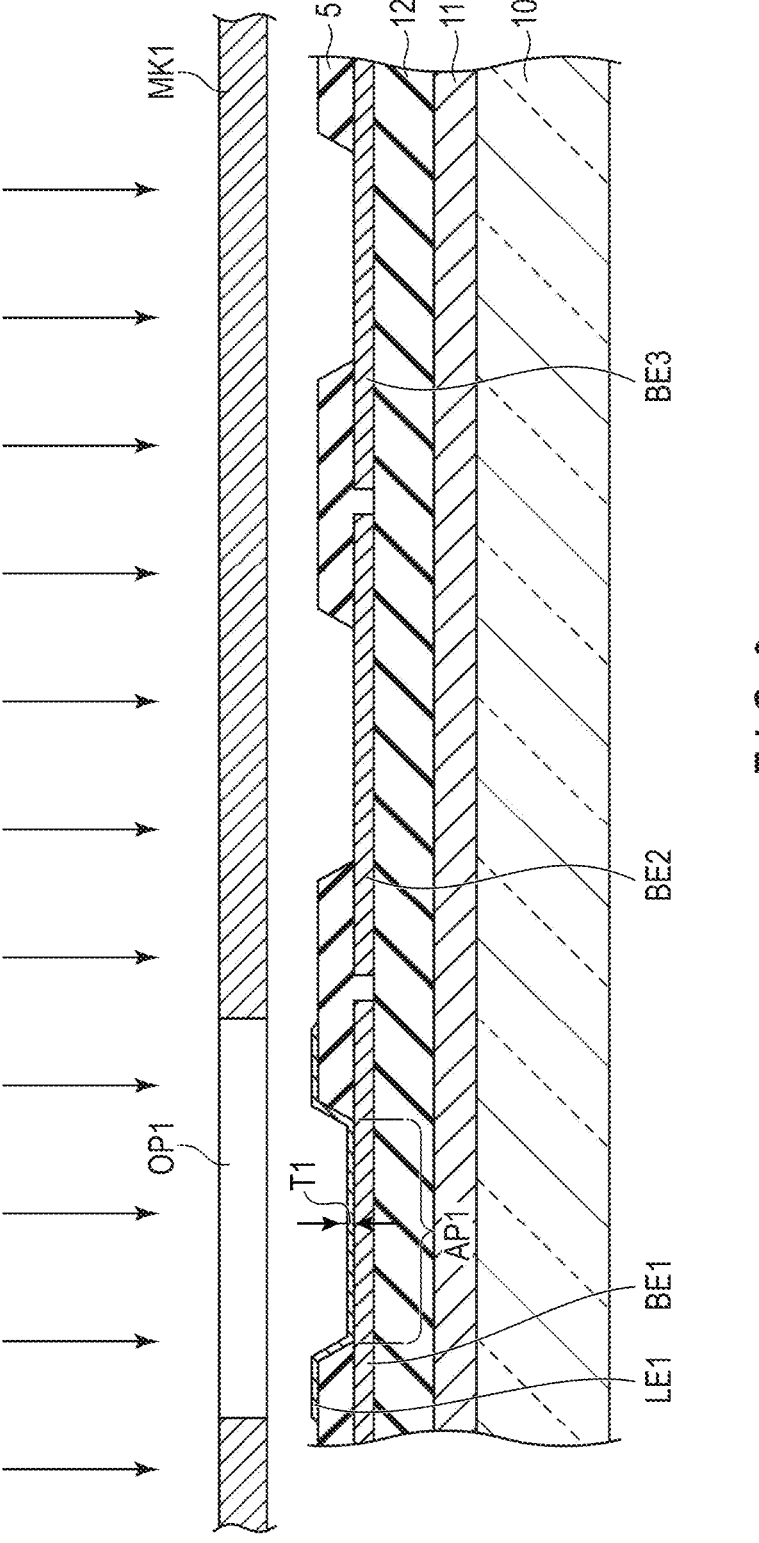
FIG. 9 is a diagram for explaining a manufacturing process following FIG. 8.

Subsequently, as shown in FIG. 9, a mask MK1 comprising an aperture OP1 corresponding to the shape of the lower electrode LE1 is prepared, and the second metal material is deposited via the mask MK1 to form the lower electrode LE1 in the aperture AP1. The second metal material is silver. Thickness T1 of the lower electrode LE1 is, for example, 20 nm.

Subsequently, as shown in FIG. 10, a mask MK2 comprising an aperture OP2 corresponding to the shape of the lower electrode LE2 is prepared, and the second metal material (silver) is deposited via the mask MK2 to form the lower electrode LE2 in the aperture AP2. Thickness T2 of the lower electrode LE2 is greater than thickness T1 and is, for example, 40 nm.

Subsequently, as shown in FIG. 11, a mask MK3 comprising an aperture OP3 corresponding to the shape of the lower electrode LE3 is prepared, and the second metal material (silver) is deposited via the mask MK3 to form the lower electrode LE3 in the aperture AP3. Thickness T3 of the lower electrode LE3 is, for example, 50 nm.

Subsequently, as shown in FIG. 12, a mask MK11 comprising an aperture OP11 corresponding to the shape of the organic layer OR1 is prepared, and various materials for forming the organic layer OR1 are deposited in series via the mask MK11. For example, the process of forming the organic layer OR1 includes the process of forming the hole injection layer on the lower electrode LE1, the process of forming the hole transport layer on the hole injection layer, the process of forming the electron blocking layer on the hole transport layer, the process of forming the light emitting layer EM1 on the electron blocking layer, the process of forming the hole blocking layer on the light emitting layer EM1, the process of forming the electron transport layer on the hole blocking layer and the process of forming the electron injection layer on the electron transport layer.

Subsequently, as shown in FIG. 13, a mask MK12 comprising an aperture OP12 corresponding to the shape of the organic layer OR2 is prepared, and various materials for forming the organic layer OR2 are deposited in series via the mask MK12. For example, the process of forming the organic layer OR2 includes the processes of forming the hole injection layer, the hole transport layer, the electron blocking layer, the light emitting layer EM2, the hole blocking layer, the electron transport layer and the electron injection layer in a manner similar to that of the process of forming the organic layer OR1.

Subsequently, as shown in FIG. 14, a mask MK13 comprising an aperture OP13 corresponding to the shape of the organic layer OR3 is prepared, and various materials for forming the organic layer OR3 are deposited in series via the mask MK13. For example, the process of forming the organic layer OR3 includes the processes of forming the hole injection layer, the hole transport layer, the electron blocking layer, the light emitting layer EM3, the hole blocking layer, the electron transport layer and the electron injection layer in a manner similar to that of the process of forming the organic layer OR1.

It should be noted that the hole injection layer may be a common layer. In other words, the material for forming the hole injection layer may be deposited on the lower electrodes LE1, LE2 and LE3 via a rough mask before the organic layers OR1, OR2 and OR3 are formed.

It should be noted that at least one of the hole transport layer, the electron blocking layer, the hole blocking layer, the electron transport layer and the electron injection layer may be a common layer.

Thus, the process of forming the lower electrode LE1 in FIG. 9 to the process of forming the organic layer OR3 in FIG. 14 can be performed without consistently breaking a vacuum. In this manner, the lower electrodes LE1, LE2 and LE3 which are silver layers are not exposed to the atmosphere or are not exposed to chemicals. Thus, the damage to the lower electrodes LE1, LE2 and LE3 is reduced, and the reduction in the reflectance as reflecting electrodes is prevented.

Subsequently, as shown in FIG. 15, a mixture of magnesium and silver is deposited on the organic layers OR1, OR2 and OR3 to form the upper electrode UE.

By this process, the display element 201 is formed in subpixel SP1, and the display element 202 is formed in subpixel SP2, and the display element 203 is formed in subpixel SP3.

The display element 201 comprises the base electrode BE1, the lower electrode LE1, the organic layer OR1 and the upper electrode UE. The display element 202 comprises the base electrode BE2, the lower electrode LE2, the organic layer OR2 and the upper electrode UE. The display element 203 comprises the base electrode BE3, the lower electrode LE3, the organic layer OR3 and the upper electrode UE.

Subsequently, as shown in FIG. 16, the transparent layer TL1 which is a high-refractive layer is formed on the upper electrode UE, and subsequently, the transparent layer TL2 which is a low-refractive layer is formed on the transparent layer TL1.

Subsequently, silicon nitride is deposited by a CVD method to form the sealing layer SE1. Subsequently, transparent resin is applied by an ink-jet method to form the resin layer 13. Subsequently, silicon nitride is deposited by a CVD method to form the sealing layer SE2. By this process, the cross-sectional structure shown in FIG. 3 is obtained.

In this configuration example, light is not absorbed by ITO, and further, the damage caused in the manufacturing process of the lower electrodes which constitute reflecting electrodes is reduced. Thus, the luminous efficiency can be improved.

Now, this specification explains another configuration example.

FIG. 17 is a cross-sectional view showing another configuration example of the display device DSP along the A-B line of FIG. 2.

The configuration example shown in FIG. 17 is different from the configuration example shown in FIG. 3 in the following respects. An intermediate electrode ME1 is provided between the base electrode BE1 and the lower electrode LE1. An intermediate electrode ME2 is provided between the base electrode BE2 and the lower electrode LE2. An intermediate electrode ME3 is provided between the base electrode BE3 and the lower electrode LE3. Hereinafter, basically, the main differences are explained.

The intermediate electrode ME1 is in contact with the base electrode BE1 through the aperture AP1 and covers the base electrode BE1 exposed from the aperture AP1. The peripheral portion of the intermediate electrode ME1 is located on the rib 5. The lower electrode LE1 overlaps the intermediate electrode ME1. The organic layer OR1 covers a stacked layer body of the intermediate electrode ME1 and the lower electrode LE1. The peripheral portion of the organic layer OR1 is located outside the intermediate electrode ME1 and the lower electrode LE1 and is located on the rib 5. In the example shown in the figure, the peripheral portion of the intermediate electrode ME1 and the peripheral portion of the organic layer OR1 are in contact with the rib 5.

The intermediate electrode ME2 is in contact with the base electrode BE2 through the aperture AP2 and covers the base electrode BE2 exposed from the aperture AP2. The peripheral portion of the intermediate electrode ME2 is located on the rib 5. The intermediate electrode ME2 is spaced apart from the intermediate electrode ME1 on the rib 5. The lower electrode LE2 overlaps the intermediate electrode ME2. The organic layer OR2 covers a stacked layer body of the intermediate electrode ME2 and the lower electrode LE2. The peripheral portion of the organic layer OR2 is located outside the intermediate electrode ME2 and the lower electrode LE2 and is located on the rib 5. In the example shown in the figure, the peripheral portion of the intermediate electrode ME2 and the peripheral portion of the organic layer OR2 are in contact with the rib 5.

The intermediate electrode ME3 is in contact with the base electrode BE3 through the aperture AP3 and covers the base electrode BE3 exposed from the aperture AP3. The peripheral portion of the intermediate electrode ME3 is located on the rib 5. The intermediate electrode ME3 is spaced apart from the intermediate electrode ME2 on the rib 5. The lower electrode LE3 overlaps the intermediate electrode ME3. The organic layer OR3 covers a stacked layer body of the intermediate electrode ME3 and the lower electrode LE3. The peripheral portion of the organic layer OR3 is located outside the intermediate electrode ME3 and the lower electrode LE3 and is located on the rib 5. In the example shown in the figure, the peripheral portion of the intermediate electrode ME3 and the peripheral portion of the organic layer OR3 are in contact with the rib 5.

Each of the intermediate electrodes ME1, ME2 and ME3 is a metal electrode formed of a third metal material different from the second metal material and does not include an oxide conductive layer formed of indium tin oxide (ITO), etc. The third metal material is aluminum or an aluminum alloy.

The thickness of each of the intermediate electrodes ME1, ME2 and ME3 should be preferably greater than or equal to 50 nm. Alternatively, the sum of the thicknesses of the base electrode BE1 and the intermediate electrode ME1, the sum of the thicknesses of the base electrode BE2 and the intermediate electrode ME2 and the sum of the thicknesses of the base electrode BE3 and the intermediate electrode ME3 should be preferably greater than or equal to 50 nm.

In this configuration example, similarly, no oxide conductive layer is present immediately under the organic layer OR1 in the aperture AP1. The stacked layer body of the base electrode BE1, the intermediate electrode ME1 and the lower electrode LE1 functions as a reflecting electrode which reflects the light emitted from the light emitting layer EM1 of the organic layer OR1.

Similarly, no oxide conductive layer is present immediately under the organic layer OR2 in the aperture AP2. The stacked layer body of the base electrode BE2, the intermediate electrode ME2 and the lower electrode LE2 functions as a reflecting electrode which reflects the light emitted from the light emitting layer EM2 of the organic layer OR2.

Similarly, no oxide conductive layer is present immediately under the organic layer OR3 in the aperture AP3. The stacked layer body of the base electrode BE3, the intermediate electrode ME3 and the lower electrode LE3 functions as a reflecting electrode which reflects the light emitted from the light emitting layer EM3 of the organic layer OR3.

Now, this specification explains the manufacturing method of the display device DSP described above with reference to FIG. 18 to FIG. 20.

The explanations of the process of forming the base electrodes BE1, BE2 and BE3 and the process of forming the rib 5 in FIG. 6 to FIG. 8 are omitted.

Figure 18:
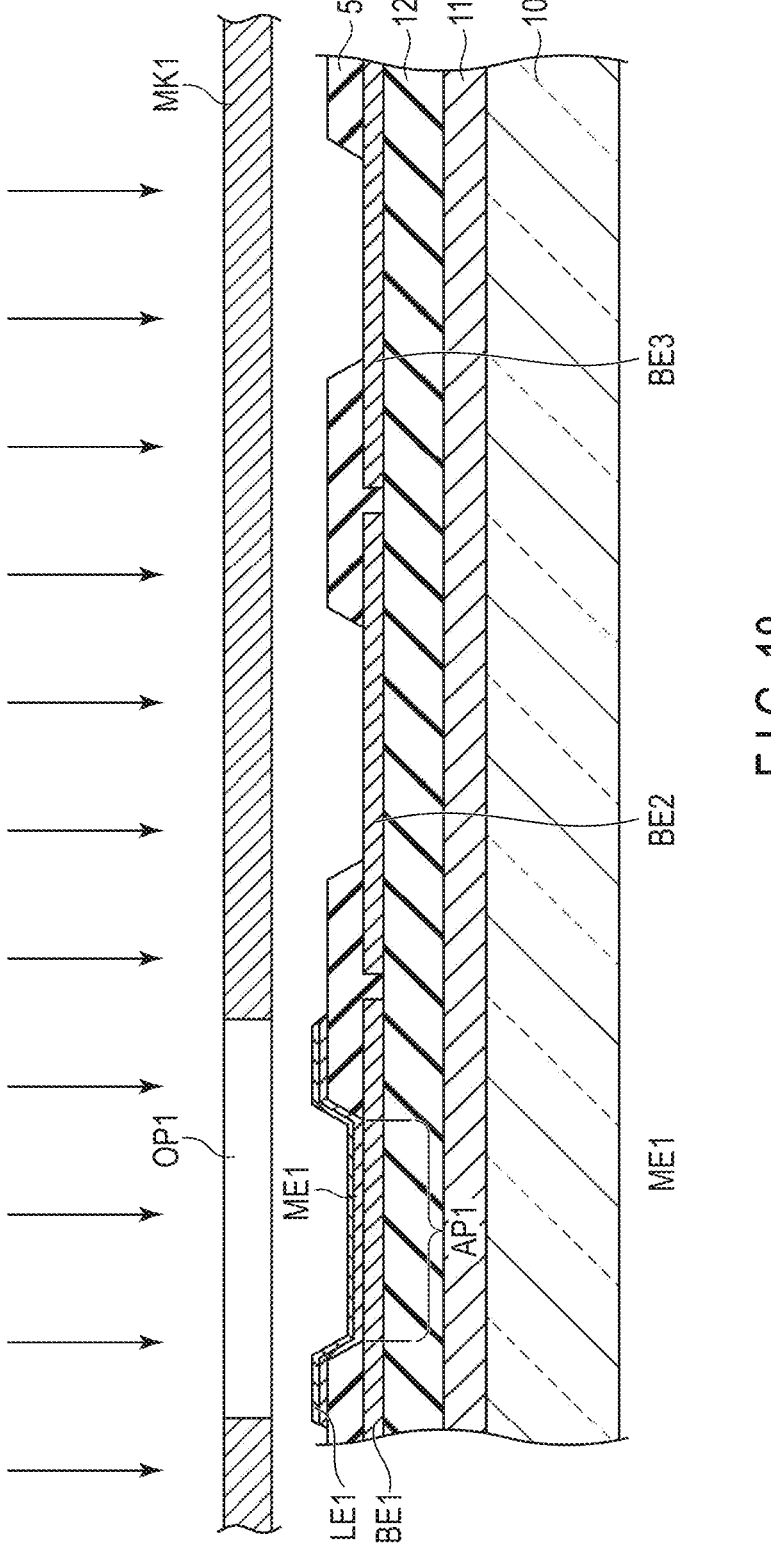
FIG. 18 is a diagram for explaining the manufacturing process of the display device DSP shown in FIG. 17.

As shown in FIG. 18, a mask MK1 comprising an aperture OP1 corresponding to the shapes of the intermediate electrode ME1 and the lower electrode LE1 is prepared, and the third metal material is deposited via the mask MK1 to form the intermediate electrode ME1 in the aperture AP1. Subsequently, the second metal material is deposited via the mask MK1 to form the lower electrode LE1 which overlaps the intermediate electrode ME1. The second metal material is silver. The third metal material is aluminum.

As shown in FIG. 19, a mask MK2 comprising an aperture OP2 corresponding to the shapes of the intermediate electrode ME2 and the lower electrode LE2 is prepared, and the third metal material (aluminum) is deposited via the mask MK2 to form the intermediate electrode ME2 in the aperture AP2. Subsequently, the second metal material (silver) is deposited via the mask MK2 to form the lower electrode LE2 which overlaps the intermediate electrode ME2.

As shown in FIG. 20, a mask MK3 comprising an aperture OP3 corresponding to the shapes of the intermediate electrode ME3 and the lower electrode LE3 is prepared, and the third metal material (aluminum) is deposited via the mask MK3 to form the intermediate electrode ME3 in the aperture AP3. Subsequently, the second metal material (silver) is deposited via the mask MK3 to form the lower electrode LE3 which overlaps the intermediate electrode ME3.

Subsequently, the organic layer OR1 explained with reference to FIG. 12 is formed, and the organic layer OR2 explained with reference to FIG. 13 is formed, and the organic layer OR3 explained with reference to FIG. 14 is formed. Subsequently, the upper electrode UE explained with reference to FIG. 15 is formed, and the transparent layers TL1 and TL2 explained with reference to FIG. 16 are formed, and further, the sealing layer SE1, the resin layer 13 and the sealing layer SE2 are formed. By this process, the cross-sectional structure shown in FIG. 17 is obtained.

In this configuration example, effects similar to those of the configuration example explained previously can be obtained. In addition, even if a base electrode is damaged in the manufacturing process, as an intermediate electrode is formed using the same material as the base electrode immediately before the formation of a lower electrode, the reduction in the reflectance of the reflecting electrode can be prevented.

In the embodiment described above, for example, the aperture AP1 corresponds to a first aperture. The aperture AP2 corresponds to a second aperture. The base electrode BE1 corresponds to a first base electrode. The base electrode BE2 corresponds to a second base electrode. The lower electrode LE1 corresponds to a first lower electrode. The lower electrode LE2 corresponds to a second lower electrode. The organic layer OR1 corresponds to a first organic layer. The organic layer OR2 corresponds to a second organic layer. The intermediate electrode ME1 corresponds to a first intermediate electrode. The intermediate electrode ME2 corresponds to a second intermediate electrode.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:
a substrate;
first and second base electrodes provided above the substrate and spaced apart from each other;
a rib which comprises a first aperture overlapping the first base electrode and a second aperture overlapping the second base electrode;
a first lower electrode provided in the first aperture and electrically connected to the first base electrode;
a second lower electrode provided in the second aperture and electrically connected to the second base electrode;
a first organic layer configured to emit light which exhibits a first color and covering the first lower electrode;
a second organic layer configured to emit light which exhibits a second color different from the first color and covering the second lower electrode; and
an upper electrode provided on the first organic layer and the second organic layer, wherein
a peripheral portion of each of the first base electrode and the second base electrode is covered with the rib,
each of the first base electrode and the second base electrode is formed of a first metal material,
a peripheral portion of each of the first lower electrode and the second lower electrode is located on the rib,
each of the first lower electrode and the second lower electrode is formed of a second metal material different from the first metal material, and
a thickness of the first lower electrode is different from a thickness of the second lower electrode.

2. The display device of claim 1, wherein
the second color is a color whose wavelength is longer than the first color, and
the thickness of the second lower electrode is greater than the thickness of the first lower electrode.

3. The display device of claim 1, wherein
the first metal material is aluminum or an aluminum alloy, and
the second metal material is silver.

4. The display device of claim 1, wherein
a thickness of each of the first base electrode and the second base electrode is greater than or equal to 50 nm.

5. The display device of claim 1, wherein
the thickness of each of the first lower electrode and the second lower electrode is greater than or equal to 10 nm.

6. The display device of claim 1, wherein
the thickness of the first lower electrode is less than a thickness of the first base electrode.

7. The display device of claim 1, wherein
the thickness of the second lower electrode is equal to a thickness of the second base electrode or less than the thickness of the second base electrode.

8. The display device of claim 1, wherein
the first lower electrode is in contact with the first base electrode, and
the second lower electrode is in contact with the second base electrode.

9. The display device of claim 1, further comprising:
a first intermediate electrode interposed between the first base electrode and the first lower electrode; and
a second intermediate electrode interposed between the second base electrode and the second lower electrode, wherein
a peripheral portion of each of the first intermediate electrode and the second intermediate electrode is located on the rib, and
each of the first intermediate electrode and the second intermediate electrode is formed of a third metal material different from the second metal material.

10. The display device of claim 9, wherein
the third metal material is aluminum or an aluminum alloy.

11. A manufacturing method of a display device, comprising:
forming a metal layer by depositing a first metal material above a substrate;
forming first and second base electrodes spaced apart from each other by patterning the metal layer;
forming a rib which comprises a first aperture overlapping the first base electrode and a second aperture overlapping the second base electrode;
forming a first lower electrode in the first aperture by depositing a second metal material different from the first metal material via a first mask;
forming a second lower electrode in the second aperture by depositing the second metal material via a second mask;
forming a first organic layer which covers the first lower electrode;
forming a second organic layer which covers the second lower electrode; and
forming an upper electrode on the first organic layer and the second organic layer, wherein
a thickness of the first lower electrode is different from a thickness of the second lower electrode.

12. The manufacturing method of claim 11, wherein
the first organic layer is configured to emit light which exhibits a first color,
the second organic layer is configured to emit light which exhibits a second color whose wavelength is longer than the first color, and
the thickness of the second lower electrode is formed so as to be greater than the thickness of the first lower electrode.

13. The manufacturing method of claim 11, wherein
the first metal material is aluminum or an aluminum alloy,
and
the second metal material is silver.

14. The manufacturing method of claim 11, further comprising:
forming a first intermediate electrode in the first aperture
by depositing a third metal material different from the
second metal material via the first mask before forming
the first lower electrode; and
forming a second intermediate electrode in the second
aperture by depositing the third metal material via the
second mask before forming the second lower electrode.

15. The manufacturing method of claim 14, wherein
the third metal material is aluminum or an aluminum
alloy.

\* \* \* \* \*